(12) United States Patent
Yu et al.

(10) Patent No.: US 12,051,655 B2
(45) Date of Patent: Jul. 30, 2024

(54) PACKAGE STRUCTURE AND METHOD OF FORMING THE SAME

(71) Applicant: Taiwan Semiconductor Manufacturing Company, Ltd., Hsinchu (TW)

(72) Inventors: Jen-Jui Yu, Taipei (TW); Ching-Hua Hsieh, Hsinchu (TW); Cheng-Ting Chen, Taichung (TW); Hsiu-Jen Lin, Hsinchu County (TW); Wei-Yu Chen, Taipei (TW); Chih-Chiang Tsao, Taoyuan (TW); Chao-Wei Chiu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 139 days.

(21) Appl. No.: 17/377,387

(22) Filed: Jul. 16, 2021

(65) Prior Publication Data
US 2023/0014450 A1 Jan. 19, 2023

(51) Int. Cl.
*H01L 23/00* (2006.01)
*H01L 21/48* (2006.01)
(Continued)

(52) U.S. Cl.
CPC ........ *H01L 23/562* (2013.01); *H01L 21/4853* (2013.01); *H01L 21/6836* (2013.01); *H01L 24/16* (2013.01); *H01L 24/20* (2013.01); *H01L 24/24* (2013.01); *H01L 24/25* (2013.01); *H01L 24/32* (2013.01); *H01L 24/73* (2013.01); *H01L 24/81* (2013.01); *H01L 24/92* (2013.01);

*H01L 25/16* (2013.01); *H01L 2221/68331* (2013.01); *H01L 2224/16265* (2013.01); *H01L 2224/214* (2013.01); *H01L 2224/24011* (2013.01);
(Continued)

(58) Field of Classification Search
None
See application file for complete search history.

(56) References Cited

U.S. PATENT DOCUMENTS 5,914,536 A * 6/1999 Shizuki ................ H05K 3/3452
257/E21.511
6,232,563 B1 * 5/2001 Kim .................. H01L 23/49816
257/737
(Continued)

FOREIGN PATENT DOCUMENTS

CN 1823410 A * 8/2006 ............. H01L 24/11
CN 102237329 A * 11/2011
(Continued)

*Primary Examiner* — Telly D Green
(74) *Attorney, Agent, or Firm* — JCIPRNET

(57) ABSTRACT

A package structure and a method of forming the same are provided. The package structure includes a die, an encapsulant, a redistribution layer (RDL) structure, a passive device, and a plurality of dummy items. The encapsulant laterally encapsulates the die. The RDL structure is disposed on the die and the encapsulant. The passive device is disposed on and electrically bonded to the RDL structure. The plurality of dummy items are disposed on the RDL structure and laterally aside the passive device, wherein top surfaces of the plurality of dummy items are higher than a top surface of the passive device.

20 Claims, 28 Drawing Sheets

(51) Int. Cl.
*H01L 21/683* (2006.01)
*H01L 25/16* (2023.01)

(52) U.S. Cl.
CPC .......... *H01L 2224/24105* (2013.01); *H01L 2224/24155* (2013.01); *H01L 2224/24265* (2013.01); *H01L 2224/25171* (2013.01); *H01L 2224/32225* (2013.01); *H01L 2224/32245* (2013.01); *H01L 2224/32265* (2013.01); *H01L 2224/73204* (2013.01); *H01L 2224/73209* (2013.01); *H01L 2224/73217* (2013.01); *H01L 2224/81024* (2013.01); *H01L 2224/81815* (2013.01); *H01L 2224/9211* (2013.01); *H01L 2224/92133* (2013.01); *H01L 2224/92135* (2013.01); *H01L 2924/1815* (2013.01); *H01L 2924/19011* (2013.01); *H01L 2924/19104* (2013.01)

(56) References Cited

U.S. PATENT DOCUMENTS

| | | | |
|---|---|---|---|
| 8,039,304 B2 * | 10/2011 | Pagaila | H01L 24/82 |
| | | | 257/E21.705 |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 10,157,888 B1 * | 12/2018 | Lin | H01L 21/6835 |
| 10,636,765 B2 * | 4/2020 | Yang | H01L 25/50 |
| 10,797,024 B2 * | 10/2020 | Yang | H01L 25/16 |
| 10,804,233 B1 | 10/2020 | Khandekar | H01L 24/13 |
| 10,832,985 B2 * | 11/2020 | Chiang | H01L 23/3171 |
| 10,879,224 B2 * | 12/2020 | Chen | H01L 24/33 |
| 11,158,576 B2 * | 10/2021 | Chang | H01L 23/3185 |
| 11,482,497 B2 * | 10/2022 | Lin | H01L 21/568 |
| 2004/0048202 A1 * | 3/2004 | Lay | H01L 24/16 |
| | | | 430/311 |
| 2012/0217607 A1 * | 8/2012 | Hanai | H01L 27/1469 |
| | | | 438/66 |
| 2012/0228749 A1 * | 9/2012 | Pagaila | H01L 23/49838 |
| | | | 257/659 |
| 2013/0161776 A1 * | 6/2013 | Iizuka | H01L 23/49822 |
| | | | 257/433 |
| 2013/0221455 A1 * | 8/2013 | Manack | G01J 5/12 |
| | | | 257/431 |
| 2015/0235990 A1 * | 8/2015 | Cheng | H01L 23/13 |
| | | | 257/773 |
| 2015/0325507 A1 * | 11/2015 | Uzoh | B23K 35/0266 |
| | | | 257/737 |
| 2016/0118332 A1 * | 4/2016 | Lin | H01L 22/20 |
| | | | 257/773 |
| 2016/0190056 A1 * | 6/2016 | Park | H01L 23/3121 |
| | | | 257/692 |
| 2017/0040266 A1 * | 2/2017 | Lin | H01L 23/5385 |
| 2018/0068870 A1 * | 3/2018 | Tsai | H01L 23/49816 |
| 2018/0269181 A1 * | 9/2018 | Yang | H01L 21/561 |
| 2018/0358288 A1 * | 12/2018 | Lee | H01L 24/20 |
| 2019/0311978 A1 * | 10/2019 | Cheah | H01L 23/49838 |
| 2019/0371734 A1 * | 12/2019 | Chang | H01L 24/83 |
| 2020/0105638 A1 * | 4/2020 | Chiang | H01L 21/561 |
| 2020/0135708 A1 * | 4/2020 | Chen | H01L 23/3121 |
| 2020/0144235 A1 * | 5/2020 | Kang | H01L 21/481 |
| 2020/0266168 A1 * | 8/2020 | Niwa | H01L 24/09 |
| 2020/0294912 A1 * | 9/2020 | Tai | H01L 24/73 |
| 2020/0294920 A1 * | 9/2020 | Hariri | H01L 23/5385 |
| 2020/0294921 A1 * | 9/2020 | Liu | H01L 25/50 |
| 2020/0303316 A1 * | 9/2020 | Chang | H01L 21/6835 |
| 2020/0402941 A1 * | 12/2020 | Olson | H01L 24/11 |
| 2021/0020560 A1 * | 1/2021 | Wang | H01L 23/145 |
| 2021/0066211 A1 * | 3/2021 | Tsai | H01L 21/6836 |
| 2021/0098380 A1 * | 4/2021 | Chen | H01L 21/4857 |
| 2021/0098382 A1 * | 4/2021 | Lin | H01L 21/4857 |
| 2021/0202392 A1 * | 7/2021 | Kung | H01L 23/5385 |
| 2021/0280511 A1 * | 9/2021 | Tai | H01L 23/3731 |
| 2021/0343638 A1 * | 11/2021 | Chu | H01L 23/5226 |
| 2021/0366800 A1 * | 11/2021 | Lee | H01L 21/78 |
| 2021/0398908 A1 * | 12/2021 | Jin | H01L 24/19 |
| 2022/0139945 A1 * | 5/2022 | Jung | H01L 25/50 |
| | | | 257/324 |
| 2022/0223534 A1 * | 7/2022 | Lin | H01L 23/5385 |
| 2022/0278067 A1 * | 9/2022 | Tseng | H01L 28/00 |

FOREIGN PATENT DOCUMENTS

| | | | | |
|---|---|---|---|---|
| CN | 111247694 A | * | 6/2020 | ........ H01L 21/4853 |
| WO | WO-2005008767 A2 | * | 1/2005 | ............. H01L 24/11 |

* cited by examiner

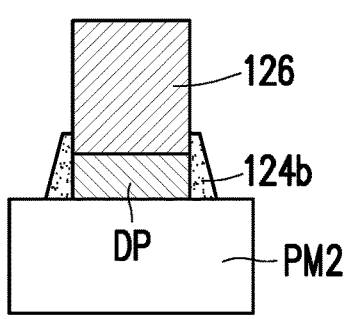
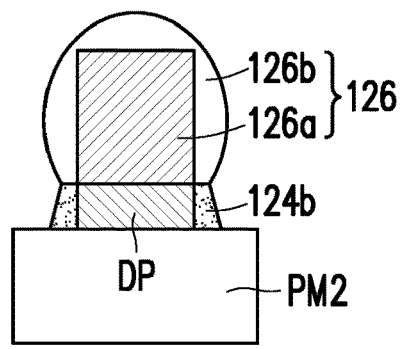
FIG. 6A  FIG. 6B
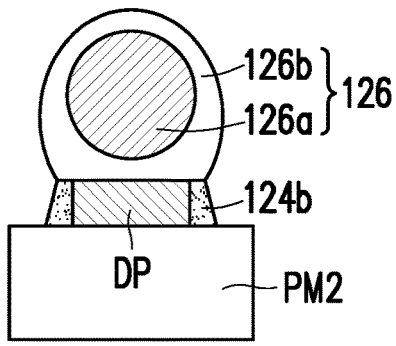
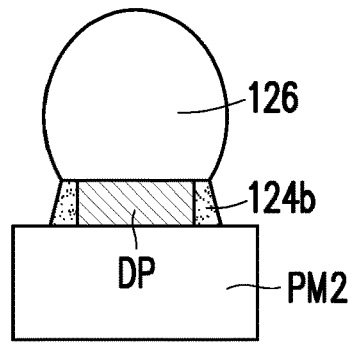
FIG. 6C  FIG. 6D
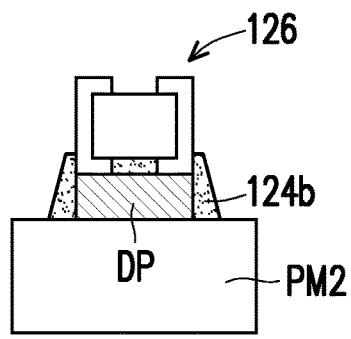
FIG. 6E

PACKAGE STRUCTURE AND METHOD OF FORMING THE SAME

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on. Currently, integrated fan-out (InFO) packages are becoming increasingly popular for their compactness.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1H is a cross-sectional view taken along line I-I' of FIG. 3B.

FIG. 6A to FIG. 6E are partial cross-sectional views of FIG. 5 which illustrates various examples of dummy item bonded to dummy pad, according to the alternative embodiments of the disclosure.

DETAILED DESCRIPTION

Figure 1A:
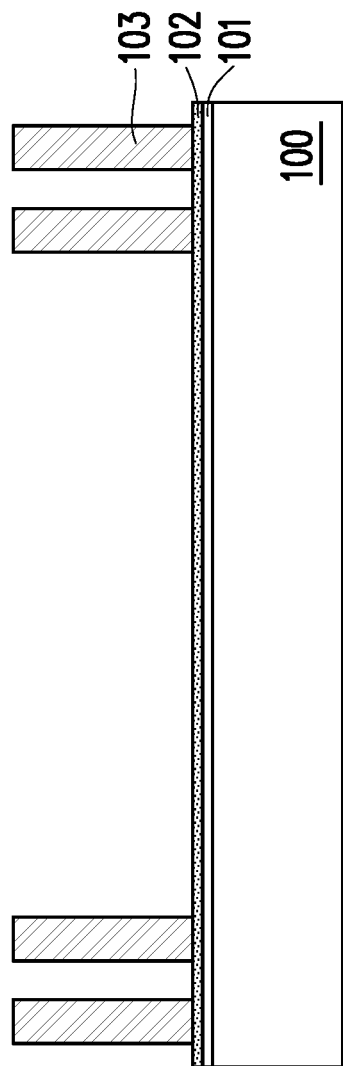
FIG. 1A to FIG. 1M are schematic cross-sectional views illustrating a method of forming a package structure according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the FIG.s. The spatially relative terms are intended to encompass different orientations of the device in use or operation in addition to the orientation depicted in the FIG.s. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1M are schematic cross-sectional views illustrating a method of forming a package structure according to some embodiments of the disclosure.

Referring to FIG. 1A, a carrier 100 is provided. The carrier 100 may be a glass carrier, a ceramic carrier, or the like. In some embodiments, the carrier 100 has a de-bonding layer 101 formed thereon. The de-bonding layer 101 is formed by, for example, a spin coating method. In some embodiments, the de-bonding layer 101 may be formed of an adhesive such as an Ultra-Violet (UV) glue, a Light-to-Heat Conversion (LTHC) glue, or the like, or other types of adhesives. The de-bonding layer 101 is decomposable under the heat of light to thereby release the carrier 100 from the overlying structures that will be formed in subsequent processes.

A dielectric layer 102 is formed on the de-bonding layer 101 over the carrier 100. In some embodiments, the dielectric layer 102 may be a polymer layer including polymer materials, but the disclosure is not limited thereto. Alternatively, the dielectric layer 102 may include inorganic dielectric materials. For example, the dielectric layer 102 may include polybenzoxazole (PBO), polyimide (PI), benzocyclobutene (BCB), ajinomoto buildup film (ABF), solder resist film (SR), or the like, a nitride such as silicon nitride, an oxide such as silicon oxide, an oxynitride such as silicon oxynitride, phosphosilicate glass (PSG), borosilicate glass (BSG), boron-doped phosphosilicate glass (BPSG), or the like, or combinations thereof. The dielectric layer 102 is formed by a suitable fabrication technique such as spin-coating, lamination, deposition such as chemical vapor deposition (CVD), or the like.

Still referring to FIG. 1A, a plurality of conductive vias 103 are formed on the dielectric layer 102. In some embodiments, the conductive vias 103 may also be referred to as through integrated fan-out vias (TIVs). The conductive via 103 includes copper, titanium, nickel, solder, alloys thereof, or the like or combinations thereof. In some embodiments, each of the conductive vias 103 includes a seed layer and a conductive post formed thereon (not individually shown). In other words, the seed layer is in contact with and vertically between the dielectric layer 102 and the conductive post. The seed layer may be a metal seed layer such as a copper seed layer. In some embodiments, the seed layer includes a first metal layer such as a titanium layer and a second metal layer such as a copper layer over the first metal layer. The conductive post may include copper or other suitable metals. However, the disclosure is not limited thereto.

In some embodiments, the conductive vias 103 may be formed by the following processes: a seed material layer is firstly formed on the dielectric layer 102 by a sputtering process, a patterned mask layer such as a patterned photoresist is formed on the seed material layer. The patterned mask layer includes openings exposing portions of seed material layer at the locations where the conductive vias 103 are to be formed. The conductive posts are then formed on the seed material layer exposed by the patterned mask layer. The patterned mask layer is stripped, and the portions of the seed material layer not covered by the conductive posts are removed. As such, the conductive posts and the underlying seed layers constitute the conductive vias 103. In some other embodiments, the conductive vias 103 further include a barrier layer (not shown) under the seed layer to prevent metal diffusion. The material of the barrier layer includes, for instance, metal nitride such as titanium nitride, tantalum nitride, or a combination thereof.

Figure 1B:
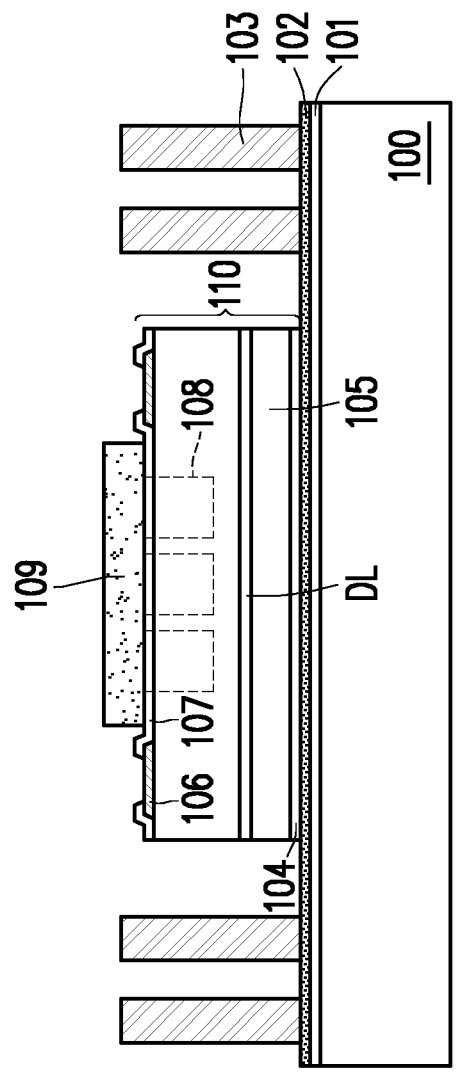
Figure 1C:
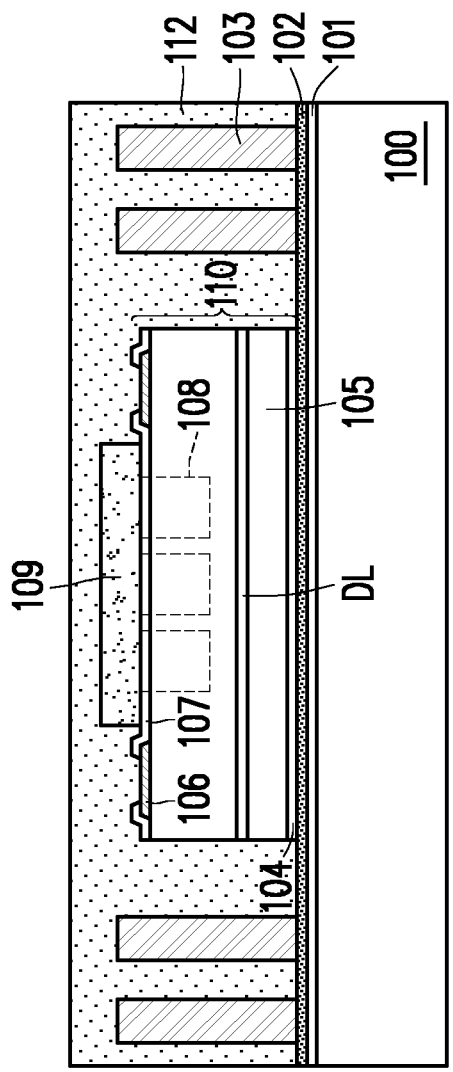

Referring to FIG. 1B, a die 110 is mounted to the carrier 100 by pick and place processes, for example. In some embodiments, the die 110 is attached to the dielectric layer 102 through an adhesive layer 104 such as a die attach film (DAF), silver paste, or the like. In some embodiments, the die 110 is one of a plurality of dies cut apart from a wafer, for example. The die 110 may be an application-specific integrated circuit (ASIC) chip, an analog chip, a sensor chip, a wireless and radio frequency chip, a voltage regulator chip, a memory chip, or any other suitable type of die. The number of the die 110 shown in FIG. 1C is merely for illustration, and the disclosure is not limited thereto. In some embodiments, a plurality of dies 110 may be mounted over the carrier 100, and the plurality of dies 110 may be the same types of dies or the different types of dies.

The die 110 is disposed between the TIVs 103, that is, the TIVs 103 are aside or around the die 110. In some embodiments, the die 110 may include a substrate 105, a plurality of conductive pads 106, and a passivation layer 107. In some embodiments, the substrate 105 is made of silicon and/or other semiconductor materials. Alternatively or additionally, the substrate 105 includes other elementary semiconductor materials such as germanium, gallium arsenic, or other suitable semiconductor materials. In some embodiments, the substrate 105 may further include other features such as various doped regions, a buried layer, and/or an epitaxy layer. Moreover, in some embodiments, the substrate 105 is made of an alloy semiconductor such as silicon germanium, silicon germanium carbide, gallium arsenic phosphide, or gallium indium phosphide. Furthermore, the substrate 105 may be a semiconductor on insulator such as silicon on insulator (SOI) or silicon on sapphire.

In some embodiments, a plurality of devices (not shown) are formed in and/or on the substrate 105. The devices may be active devices, passive devices, or combinations thereof. In some embodiments, the devices are integrated circuit devices. The devices are, for example, transistors, capacitors, resistors, diodes, photodiodes, fuse devices, or the like, or combinations thereof.

In some embodiments, an interconnection structure (not specifically shown) is formed over the devices on the substrate 105. The interconnection structure may include a plurality of conductive features embedded in a dielectric structure, so as to electrically connect different devices in and/or on the substrate 105 to form a functional circuit. In some embodiments, the dielectric structure includes an inter-layer dielectric layer (ILD) and one or more inter-metal dielectric layers (IMD). The conductive features may include multiple layers of conductive lines and conductive plugs (not shown). The conductive plugs include contact plugs and via plugs. The contact plugs are located in the ILD to connect the metal lines to the devices. The via plugs are located in the IMDs to connect the metal lines in different layers. The dielectric structure includes suitable dielectric materials such as silicon oxide, silicon nitride, silicon oxynitride, low-k dielectric materials, or combinations thereof. The metallization features include metal, metal alloy or a combination thereof, such as tungsten (W), copper (Cu), copper alloys, aluminum (Al), aluminum alloys, or combinations thereof.

The conductive pads 106 may be or electrically connected to a top conductive feature of the interconnection structure, and further electrically connected to the devices formed on the substrate 105 through the interconnection structure. The material of the conductive pads 106 may include metal or metal alloy, such as aluminum, copper, nickel, or alloys thereof.

The passivation layer 107 is formed over the substrate 105 and partially covers the conductive pads 106. Portions of the conductive pads 106 are exposed by the passivation layer 107 and serve as external connections of the die 110. The passivation layer 107 includes an insulating material such as silicon oxide, silicon nitride, polymer, or a combination thereof. The polymer may include PBO, PI, BCB, the like or combinations thereof.

In some embodiments, the die 110 is a sensor chip and includes a plurality of sensing regions 108. The sensing regions 108 may be pixel regions in some embodiments. The sensing regions 108 may extend from the top surface of the passivation layer 107 to the device layer DL on the substrate 105, but the disclosure is not limited thereto. In some embodiments, the sensing regions 108 are disposed between the conductive pads 106, for example. It is noted that, the shape, size and locations of the sensing regions 108 shown in the figures are merely for illustration, and the disclosure is not limited thereto.

In the embodiments in which the die 110 is a sensor chip, the die 110 may further include a sacrificial film 109 formed over the substrate 105 and covering the sensing regions 108. In some embodiments, the sacrificial film 109 overlays a portion of passivation layer 107 without covering the conductive pads 106, that is, the width of the sacrificial film 109 may be less than the width of the die 110, but the disclosure is not limited thereto. In alternative embodiments, the sacrificial film 109 may further extend to cover the conductive pads 106. For example, the sacrificial film 109 may completely cover the passivation layer 107 and the conductive pads 106. The width of the sacrificial film 109 may be substantially equal to the width of the die 110. In some embodiments, the material of the sacrificial film 109 is different from the materials of the passivation layer 107 and the subsequently formed encapsulant. For example, the sacrificial film 107 may include a polymer such as polybenzoxazole (PBO), polyimide (PI), benzocyclobutene (BCB), a combination thereof, or the like, but the disclosure is not limited thereto. In some embodiments, the die 110 is free of a connector (e.g., metal pillar) on the conductive pads 106, but the disclosure is not limited thereto.

Referring to FIG. 1C, an encapsulant material layer 112 is then formed over the carrier 100 to encapsulate the die 110 and the conductive vias 103. In some embodiments, the encapsulant material layer 112 includes a molding compound, a molding underfill, a resin such as epoxy, a combination thereof, or the like. In some other embodiments, the encapsulant material layer 112 includes a photo-sensitive material such as polybenzoxazole (PBO), polyimide (PI), benzocyclobutene (BCB), a combination thereof, or the like. In alternative embodiments, the encapsulant material layer 112 includes nitride such as silicon nitride, oxide such as silicon oxide, phosphosilicate glass (PSG), borosilicate glass (BSG), boron-doped phosphosilicate glass (BPSG), a combination thereof, or the like. In some embodiments, the encapsulant material layer 112 includes a molding compound which is a composite material including a base material (such as polymer) and a plurality of fillers distributed in the base material. The filler may be a single element, a compound such as nitride, oxide, or a combination thereof. The fillers may include silicon oxide, aluminum oxide, boron nitride, alumina, silica, or the like, for example. The cross-section shape of the filler may be circle, oval, or any other suitable shape.

In some embodiments, the encapsulant material layer 112 is formed by an over-molding process, such that the encapsulant material layer 112 has a top surface higher than top surfaces of the conductive vias 103 and the die 110. In other words, the encapsulant material layer 112 encapsulates sidewalls and top surfaces of the die 110 and the conductive vias 103.

Figure 1D:
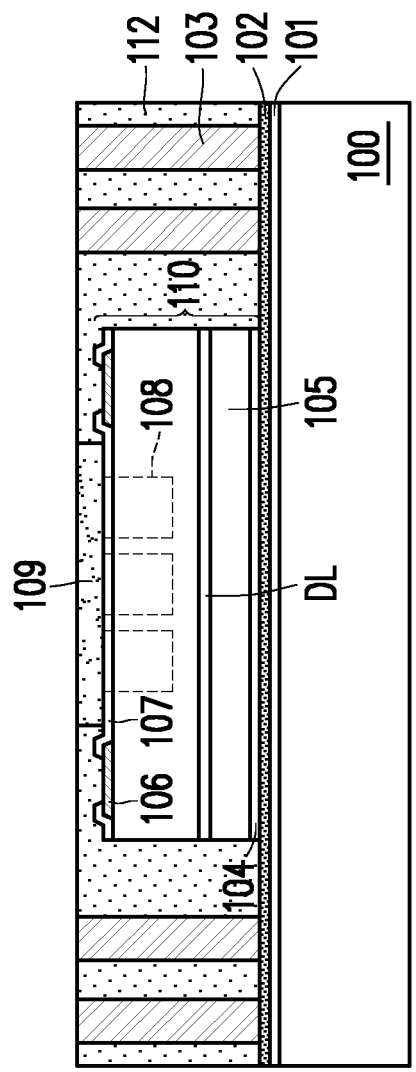
Figure 7:
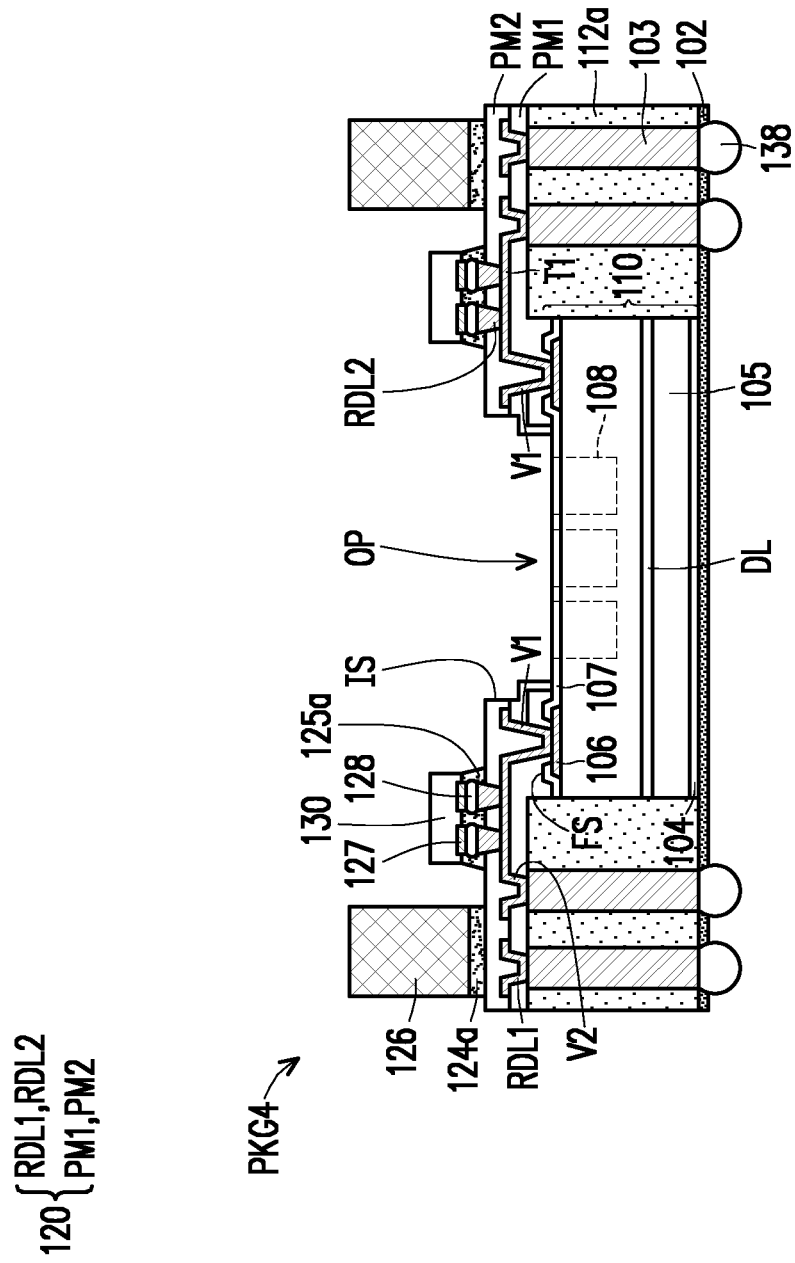
FIG. 7 is a schematic cross-sectional view illustrating a package structure according to alternative embodiments of the disclosure.

Referring to FIG. 1D, thereafter, a planarization process is performed to remove a portion of the encapsulant material layer 112 to expose the conductive vias 103 and the sacrificial film 109, and an encapsulant 112a is formed. The planarization process includes a chemical mechanical polishing (CMP) process, for example. In some embodiments, a portion of the sacrificial film 109 and/or portions of the conductive vias 103 may also be removed by the planarization process. After the planarization process is performed, the top surfaces of the encapsulant 112a, the conductive vias 103 and the sacrificial film 109 are substantially coplanar with each other. In some embodiments in which the sacrificial layer 109 partially covers the passivation layer 107, a portion of the encapsulant 112a is located on the die 110 to encapsulate and physically contact top surfaces of portions of the passivation layer 107 and the top surfaces of the conductive pads 106 uncovered by the sacrificial layer 109. In alternative embodiments in which the sacrificial layer 109 completely covers the top surfaces of the passivation layer 107 and the conductive pads 106, the encapsulant 112a is laterally aside the die 110 (as shown in FIG. 7).

Figure 1E:
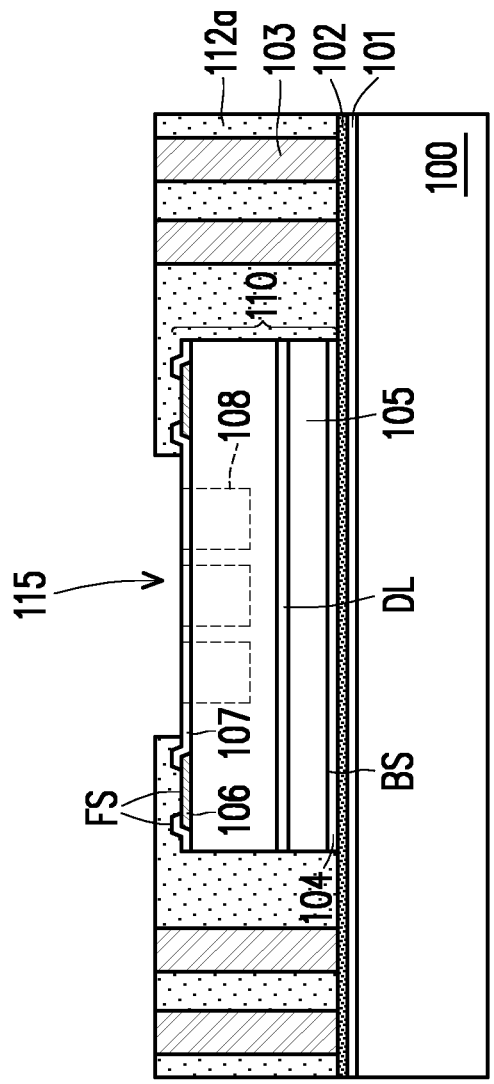

Referring to FIG. 1D and FIG. 1E, the sacrificial film 109 is removed to expose the sensing regions 108 of the die 110. The sacrificial film 109 may be removed by a suitable technique such as an etching process, a laser irradiation process, or the like. The etching process may include dry etching, wet etching or a combination thereof.

Referring to FIG. 1E, in some embodiments, after the sacrificial film 109 is removed, a portion of the passivation layer 107 is exposed, while the other portion of the passivation layer 107 and the conductive pads 106 are covered by the encapsulant 112. The top surfaces of the passivation layer 107 and the conductive pads 106 constitute the first surface FS of the die 110. The first surface FS may also be referred to as a front surface or an active surface of the die 110. In the embodiments, the first surface FS of the die 110 is lower than the top surface of the encapsulant 112a and the top surfaces of the conductive vias 103, and a portion of the first surface FS of the die 110 is encapsulated by the encapsulant 112a. The die 100 has a second surface BS opposite to the first surface FS. The second surface BS is a bottom surface of the substrate 105, and may also be referred to as a back surface of the die 110.

Still referring to FIG. 1E, a recess 115 is formed at the position previously occupied by the removed sacrificial film 109. The recess 115 is located over the die 110 and within the encapsulant 112a, and a portion of the sidewall of the encapsulant 112a is exposed by the recess 115. In other words, the recess 115 is defined by a portion of the first surface FS of the die 110 and the sidewall of the encapsulant 112a.

Figure 1F:
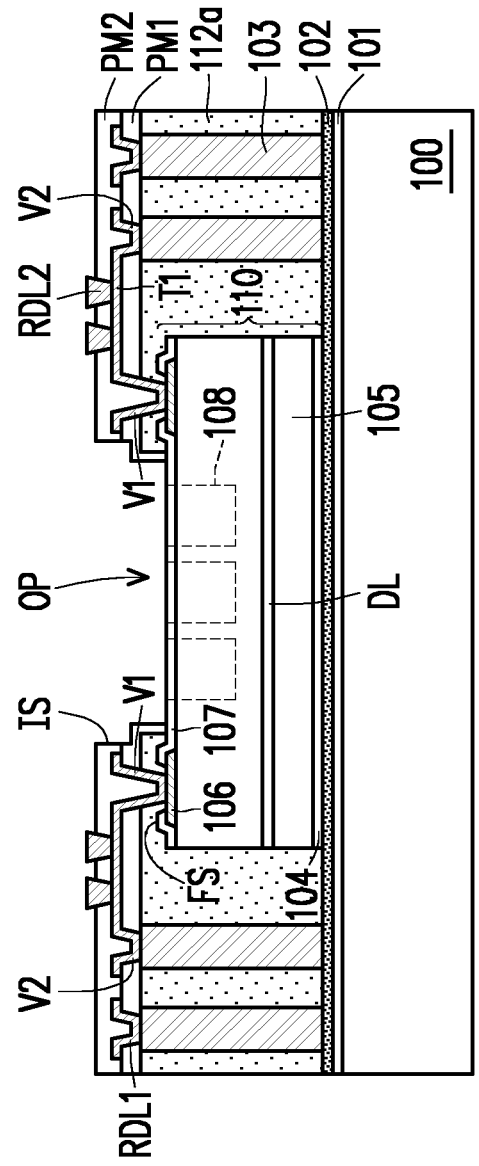

Referring to FIG. 1F, a redistribution layer (RDL) structure 120 is formed on the die 110, the conductive vias 103 and the encapsulant 112a, and electrically connected to the die 110 and the conductive vias 103. The sensing regions 108 of the die 110 may be exposed by the RDL structure 120. In some embodiments, the RDL structure 120 is also referred to as a "front-side RDL structure" formed on the front side of the die 110. Herein, the term "front-side" refers to a side close to the conductive pads 106 of the die 110.

In some embodiments, the RDL structure 120 includes multi-layers of polymer layers and redistribution layers alternatively formed on one another. For example, the RDL structure 120 includes polymer layers PM1, PM2, and redistribution layers RDL1, RDL2. The number of the polymer layers or the redistribution layers shown in FIG. 1F is merely for illustration, and the disclosure is not limited thereto. In some embodiments, each of the polymer layers PM1, PM2 includes a photo-sensitive material such as polybenzoxazole (PBO), polyimide (PI), benzocyclobutene (BCB), a combination thereof or the like, but the disclosure is not limited thereto. Each of the redistribution layers RDL1 and RDL2 includes conductive materials. The conductive materials include metal such as copper, nickel, titanium, a combination thereof or the like. In some embodiments, each of the redistribution layers RDL1 and RDL2 includes a seed layer (not shown) and a metal layer formed thereon (not shown). The seed layer may be a metal seed layer such as a copper seed layer. In some embodiments, the seed layer includes a first metal layer such as a titanium layer and a second metal layer such as a copper layer over the first metal layer. The metal layer may include copper or other suitable metals.

In some embodiments, the redistribution layer RDL1 penetrates through the polymer layer PM1 and the encapsulant 112a to connect to the conductive vias 103 and the conductive pads 106 of the die 110. The redistribution layer RDL2 penetrates through the polymer layer PM2 to connect to redistribution layer RDL1. A portion of the RDL structure 120, such as a portion of the polymer layer PM1 may fill into the recess 115 and covers a portion of the top surface of the passivation layer 107. In some embodiments, the RDL structure 120 has an opening OP overlapped and in spatial communication with the recess 115, so as to expose the sensing regions 108 of the die 110. The opening OP may be defined by a portion of front surface FS of the die 110 and the surface (i.e., inner sidewall or inner surface) IS of the RDL structure 120. It is noted that, although the RDL structure 120 is shown to have two separate parts on opposite sides of the opening OP in the cross-sectional view FIG. 1F, the RDL structure 120 is actually a continuous structure. When viewed in a top view, the RDL structure 120 may be a continuous structure with the opening OP disposed in a center region thereof.

In some embodiments, the inner surface IS of the RDL structure 120 may be configured as a stepped shape. In other words, a portion (e.g., edge portion) of the RDL structure 120 is step shaped. The inner surface IS may include a first inner sidewall landing on the die 110, a second inner sidewall over the first inner sidewall, and a substantially planar surface connecting the first inner sidewall and the second inner sidewall. The first inner sidewall is laterally shift from the second inner sidewall and more closer to a center of the die 110 than the second inner sidewall to the center of the die 110 in a horizontal direction. The planar surface may be lower than, substantially coplanar with or higher than the top surface of the polymer layer PM1. The first inner sidewall may include at least a portion of an inner sidewall of the polymer layer PM1. The second inner sidewall may include at least a portion of an inner sidewall of the polymer layer PM2. In some embodiments, a portion of the polymer layer PM1 may laterally protrude from the polymer layer PM2 and/or another portion of the polymer layer PM1. However, the disclosure is not limited thereto. In alternative embodiments, the inner surface (i.e., inner sidewall) of the RDL structure 120 may be substantially straight or inclined.

In some embodiments, the RDL structure 120 may be formed by the following processes: a first polymer material layer is formed over the carrier 100 to cover die 110 and the encapsulant 112a through a suitable technique such as spin coating, chemical vapor deposition (CVD), plasma-enhanced chemical vapor deposition (PECVD), lamination or the like. Thereafter, the redistribution layer RDL1 is formed on and penetrating through the first polymer material layer and the encapsulant 112a to connect to the conductive vias 103 and the conductive pads 106. The forming method of the redistribution layer RDL1 may include physical vapor deposition (PVD) such as sputtering process, and electroplating process. The formation of the redistribution layer RDL1 may avoid the region directly over the sensing region 108 of the die 110. Thereafter, processes for forming the polymer material layer and redistribution layer are repeated to form a second polymer material layer and the redistribution layer RDL2. The first polymer material layer and/or the second polymer material layer may fill in the recess 115 and overlay the sensing regions 108. In some embodiments, thereafter, the second and first polymer material layers are patterned to form the polymer layers PM1, PM2 having the opening OP, thereby exposing the sensing regions 108. The patterning method may include exposure and development process, laser drilling process, or the like, or combinations thereof. In some other embodiments, the pattering of the polymer material layer may be performed before the formation of the corresponding redistribution layer.

In some embodiments, the polymer layer PM1 is disposed on the encapsulant 112a and may partially fill into the recess 115 (FIG. 1E). The polymer layer PM1 may cover the top surface of the encapsulant 112a, a portion of the front surface FS of the die 110, and/or portions of the top surfaces of the conductive vias 103. In some embodiments, a portion of the polymer layer PM1 fills into the recess 115 to cover the sidewall (i.e., inner sidewall) of the encapsulant 112a. The top corners of the encapsulant 112a may be covered by the polymer layer PM1. In some embodiments, the polymer layer PM1 may be not filled in the recess 115, and the inner sidewall of the polymer layer PM1 may be substantially aligned with or laterally shifted from the inner sidewall of the encapsulant 112a.

The redistribution layer RDL1 penetrates through the polymer layer PM1 and the encapsulant 112a to electrically connect to the conductive pads 106 of the die 110 and the conductive vias 103. In some embodiments, the redistribution layer RDL1 includes a plurality of vias V1 and V2 and traces T1 electrically connected to each other. The traces T1 are located on and extending on the top surface of the polymer layer PM1. The vias V1 penetrate through the polymer layer PM1 and the underlying encapsulant 112a, so as to connect the traces T1 to the conductive pads 106 of the die 110. The vias V2 penetrate through the polymer layer PM1, so as to connect the traces T1 to the conductive vias 103. The height of the via V1 is larger than the height of the via V2, and the bottom surface of the via V1 is lower than the bottom surface of the via V2. Upper portions of the vias V1 are embedded in polymer layer PM1, while bottom portions of the vias V1 are laterally encapsulated by the encapsulant 112a and laterally aside the conductive vias 103.

The polymer layer PM2 is disposed on the polymer layer PM1 to cover the redistribution layer RDL1. In some embodiments, a portion of the polymer layer PM2 may be laterally surrounded by the vias V1 and may have a bottom surface (i.e., the bottommost surface of the polymer layer PM2) lower than a top surface of the encapsulant 112a. However, the disclosure is not limited thereto. The bottommost surface of polymer layer PM2 may be higher than or substantially coplanar with the top surface of the encapsulant 112a, which is at least partially depending on the configuration of the via V1. In some embodiments, the redistribution layer RDL2 may be a conductive via or conductive pillar protruding from the top surface of the polymer layer PM2 for further electrical connection. The cross-sectional shape of the redistribution layer RDL2 may be inverted trapezoid, square, rectangle, or the like, or any other suitable shape.

Figure 1G:
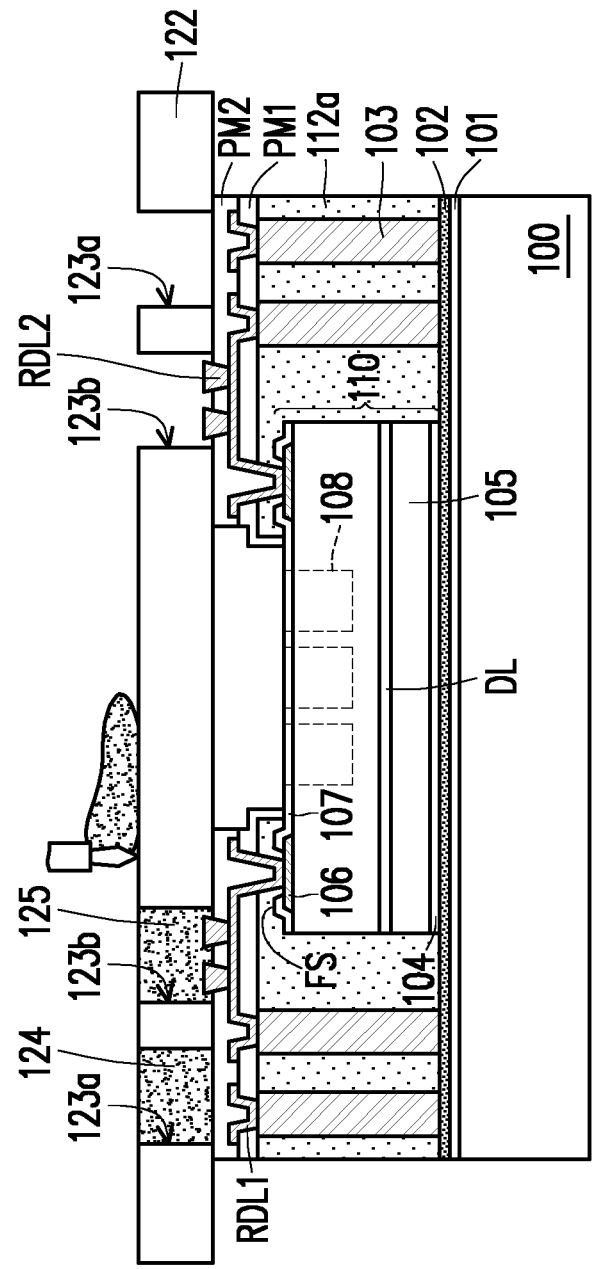

Referring to FIG. 1G, in some embodiments, adhesive materials 124 and flux materials 125 are applied onto the RDL structure 120. In some embodiments, the adhesive materials 124 and the flux materials 125 may be formed of a same material and formed by a same printing process. For example, the adhesive materials 124 and the flux materials 125 include epoxy flux which has adhesiveness as well as the function of serving flux during soldering process. The printing process may be formed by the following processes: a stencil 122 is placed onto the RDL structure 120. The stencil 122 has a plurality of openings 123a and 123b exposing portions of the top surface of the RDL structure 120. In some embodiments, the openings 123a expose portions of the top surface of the polymer layer PM2, while the openings 123b expose the redistribution layer RDL2 and portions of the polymer layer PM2 adjacent to the redistribution layer RDL2. The printing process is performed using the stencil 122, such that the adhesive materials 124 and flux materials 125 are applied/printed on the polymer layer PM2 and the redistribution layer RDL2 exposed by the openings 123a and 123b of the stencil 122, respectively. However, the disclosure is not limited thereto. In alternative embodiments, the adhesive materials 124 and the flux materials 125 may be formed of different materials and formed by separate printing processes.

Figure 1H:
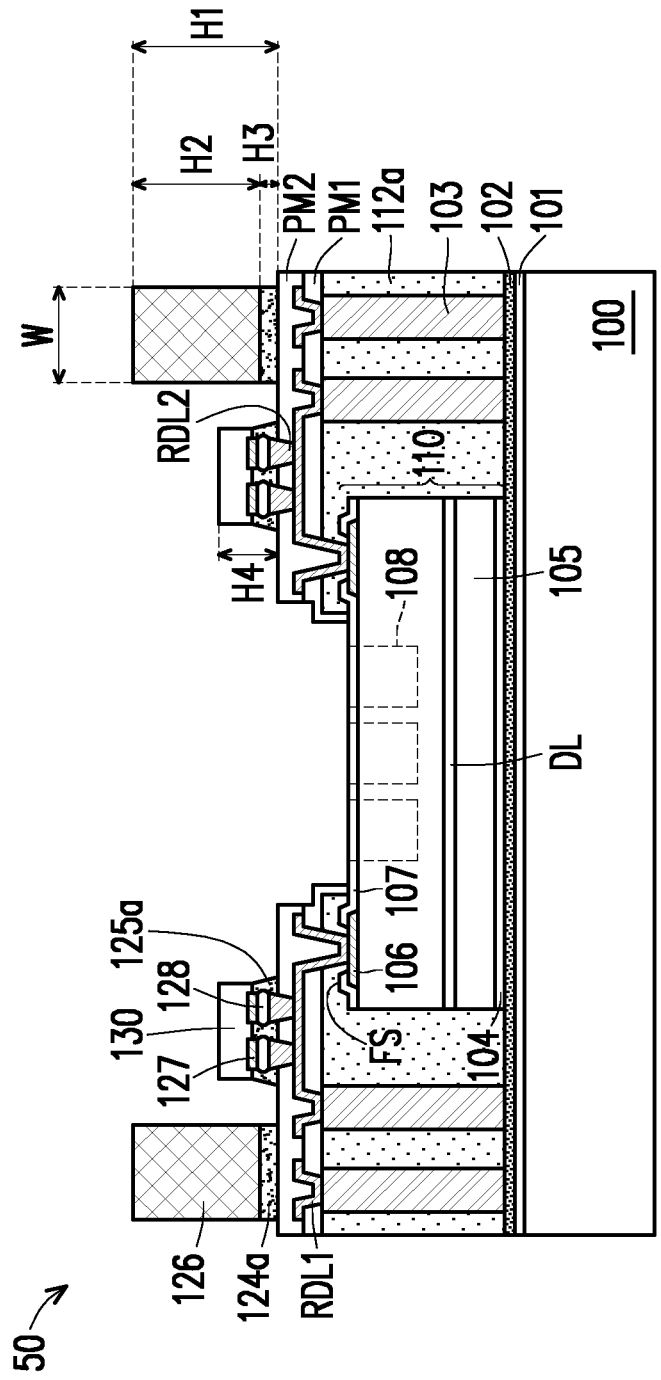

Referring to FIG. 1H, in some embodiments, a plurality of dummy items 126 are attached to the polymer layer PM2 of the RDL structure 120, and a plurality of passive devices 130 are electrically bonded to redistribution layers RDL2 of the RDL structure 120. The passive devices 130 are further electrically coupled to the die 110 through the RDL structure 120. The passive device 130 may be integrated passive device (IPD), surface mount device (SMD), or combinations thereof, but the disclosure is not limited thereto. In some embodiments, the passive device 130 includes connectors 128 electrically connected to conductive pads 127 thereof. The conductive pads 127 may include metal, such as aluminum, copper, alloys thereof, or any other suitable metallic material. The connectors 128 may be solder bumps, solder balls or other suitable metallic connectors. In some embodiments, the connectors 128 may also be referred to as conductive terminals of the passive device 130. The connectors 128 are electrically bonded to the redistribution layers RDL2.

In some embodiments, the mounting of the dummy items 126 and the passive devices 130 includes: placing the dummy items 126 onto the adhesive materials 124, placing the passive device 130 onto the redistribution layer RDL2, and the flux material 125 may be pushed outward to surround the connectors 128 and/or the conductive pads 127 of the passive device 130 and the redistribution layer RDL2; thereafter, a reflow process is performed. As such, adhesive layers 124a are formed between the dummy items 126 and the polymer layer PM2 of the RDL structure 120. In other words, the dummy items 126 are attached to the RDL structure 120 through the adhesive layers 124a. During the reflow process, a portion of the flux material 125 is reacted with connectors 128 and/or the redistribution layer RDL2 to facilitate the bonding process, and the other portion of the flux material 125 is unreacted and remained as a filling layer 125a. The filling layer 125a may also be referred to as a flux residue. As shown in FIG. 1H, the filling layer 125a is disposed to fill the space between the passive device 130 and laterally surrounding the connectors 128 and/or the conductive pads 127 of the passive device 130 and may further laterally surrounding a portion of the redistribution layer RDL2 of the RDL structure 120. In some embodiments, the adhesive layer 124a and the filling layer 125a have sizes and/or shapes that are different from the adhesive material 124 and the flux material 125, which may be caused by the mechanical force during the placement of the dummy items 126 and the passive device 130 and/or the reflow process.

In some embodiments in which the adhesive materials 124 and the flux materials 125 are formed of the same material, the material performs different functions during the mounting of the dummy items 126 and the passive devices 127. The mounting of the dummy items 126 uses the adhesiveness of the material for attaching the dummy items 126, while the mounting of the passive device 130 uses the material as a flux to facilitate the bonding process.

It is noted that, the mounting process shown in FIG. 1G to FIG. 1H is merely for illustration, and the disclosure is not limited thereto. Other suitable mounting process may also be used. For example, the passive devices 130 may be firstly bonded to the RDL structure 120, and the flux residue may be removed after the bonding process. An underfill layer may further be disposed to fill the space between the passive device 130 and the RDL structure 120. The location of the underfill layer is substantially the same as the location of the filling layer 125a shown in FIG. 1H. Thereafter, the dummy items 126 may be attached to the RDL structure 120 by an adhesive layer such as a die attach film (DAF), non-conductive film (NCF), non-conductive paste (NCP), silver paste, or the like, or other types of adhesives. The adhesive layer may be initially applied on the bottom surface of the dummy item 126 and then attached to the RDL structure 120.

Still referring to FIG. 1H, in the embodiments of the disclosure, the dummy items 126 are formed to have top surfaces higher than the top surfaces of the passive devices 130. In some embodiments, the height H1 defined by the vertical distance from the top surface of the dummy item 126 to the top surface of the polymer layer PM2 is larger than the height H4 defined by the vertical distance from the top surface of the passive device 130 to the top surface of the polymer layer PM2. The height H1 is substantially equal to the sum of the height H2 of the dummy item 126 and the height (i.e., thickness) H3 the adhesive layer 124a. In some embodiments, the height H4 may be substantially equal to the sum of the height of the passive device 130 and the height of the portion of the redistribution layer RDL2 protruding above the top surface of the polymer layer PM2. For example, the height H4 of the passive device 130 ranges from 50 μm to 650 μm. The height H2 of the dummy item 126 may range from 75 μm to 760 μm. The height H3 of the adhesive layer 124a may be greater than zero. In some embodiments, the width W of the dummy item 126 may be larger than 50 μm. If the width W is very small, such as less than 50 μm, the dummy item which has the small width and relatively large height may be fragile and easily collapsed. In other words, the dummy item 126 has sufficient dimension to be a stable structure.

The dummy items 126 may be formed of various suitable materials, such as conductive material, dielectric material, semiconductor material, or any other suitable material, or combinations thereof. Further, the dummy items 126 may have any suitable shape, as long as the height H1 is larger than the height H4. Throughout the specification, the term "dummy item" refers to the component that is electrically floating. In other words, the dummy items 126 are electrically isolated from the RDL structure 120, the passive device 130, the die 110 and the conductive vias 103.

FIG. 2A to FIG. 2E illustrate some examples of the dummy item 126 according to some embodiments of the disclosure.

Figure 2A:
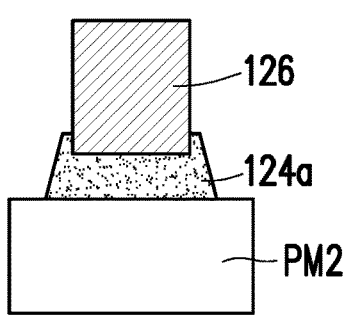
FIG. 2A to FIG. 2E are partial cross-sectional views of FIG. 1M which illustrates various examples of dummy item, according to some embodiments of the disclosure.

Referring to FIG. 1H and FIG. 2A, in some embodiments, the dummy item 126 may be a metal pillar, such as copper stud bump, and may also be referred to as a dummy pillar. In alternative embodiments, the dummy item 126 is a dummy die including semiconductor materials, such as silicon. The dummy die may be singulated from a bare wafer and is free of devices therein. The cross-sectional shape of the dummy item 126 may be square, rectangular, or the like. The adhesive layer 124a is disposed between the dummy item 126 and the polymer layer PM2. The adhesive layer 124a covers the bottom surface of the dummy item 126 and may further extend to cover (e.g., partially cover) sidewalls of the dummy item 126. The sidewalls of the adhesive layer 124a may be substantially straight or inclined.

Figure 2B:
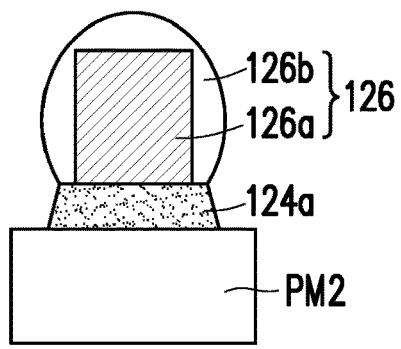

Referring to FIG. 2B, in some embodiments, the dummy item 126 may include a metal pillar 126a and a cap 126b on the metal pillar 126a. For example, the metal pillar 126a may be a copper stud bump, and the cap 126b may be a conductive cover such as a solder cover, or a dielectric cover. Other suitable materials may also be used. The cap 126b may surround and cover sidewalls and top surface of the metal pillar 126a. The cross-sectional shape of the metal pillar 126a may be square, rectangular, the like or any other suitable shape. The outer profile of the cap 126b may be rounded, circular, oval, or the like, or any other suitable shape.

Figure 2C:
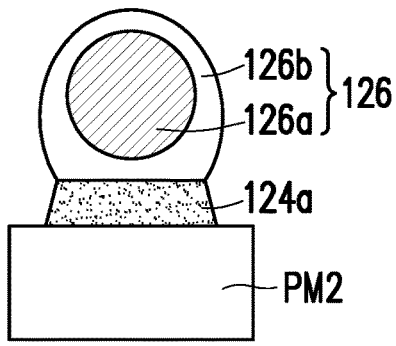

Referring to FIG. 2C, in some embodiments, the dummy item 126 includes a conductive core 126a and a cap 126b covering the conductive core 126a. The conductive core 126a may be a metal core such as a copper core ball. The cross-sectional shape of the conductive core 126a may be circular, oval, or the like. The cap 126b may be a conductive cap such as a solder cap, but the disclosure is not limited thereto. The cap 126b may also be a dielectric cap in some other embodiments. The outer profile of the cap 126b is substantially the same as those described in FIG. 2C.

Figure 2D:
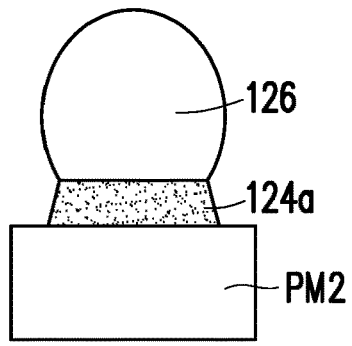

Referring to FIG. 2D, in some embodiments, the dummy item 126 may be a conductive ball, such as solder ball.

Figure 2E:
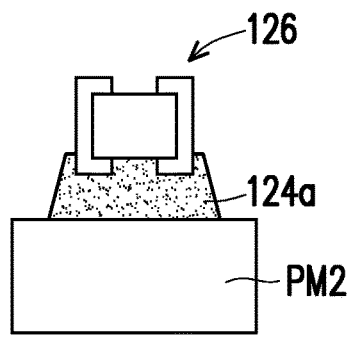

Referring to FIG. 2E, in some embodiments, the dummy item 126 may include a surface mount device (SMD) or IPD. For example, a SMD is used as the dummy item 126, and the SMD may be a resistor including a body portion and solder layers covering sidewalls and portions of the top surface and bottom surface of the body portion. The adhesive layer may cover and in contact with portions of the solder layers and a portion of the bottom surface of the body portion uncovered by the solder layers.

It is noted that, the various types of dummy items 126 described with respect to FIG. 2A to FIG. 2E are merely for illustration, and the disclosure is not limited thereto.

Referring back to FIG. 1H, in some embodiments, a plurality of dummy items 126 are formed on the RDL structure 120. The plurality of dummy items 126 may be the same types of pillars or different types of dummy items, and each of the dummy items 126 may be selected from those described in FIG. 2A to FIG. 2E or any other suitable types of dummy items.

Figure 3A:
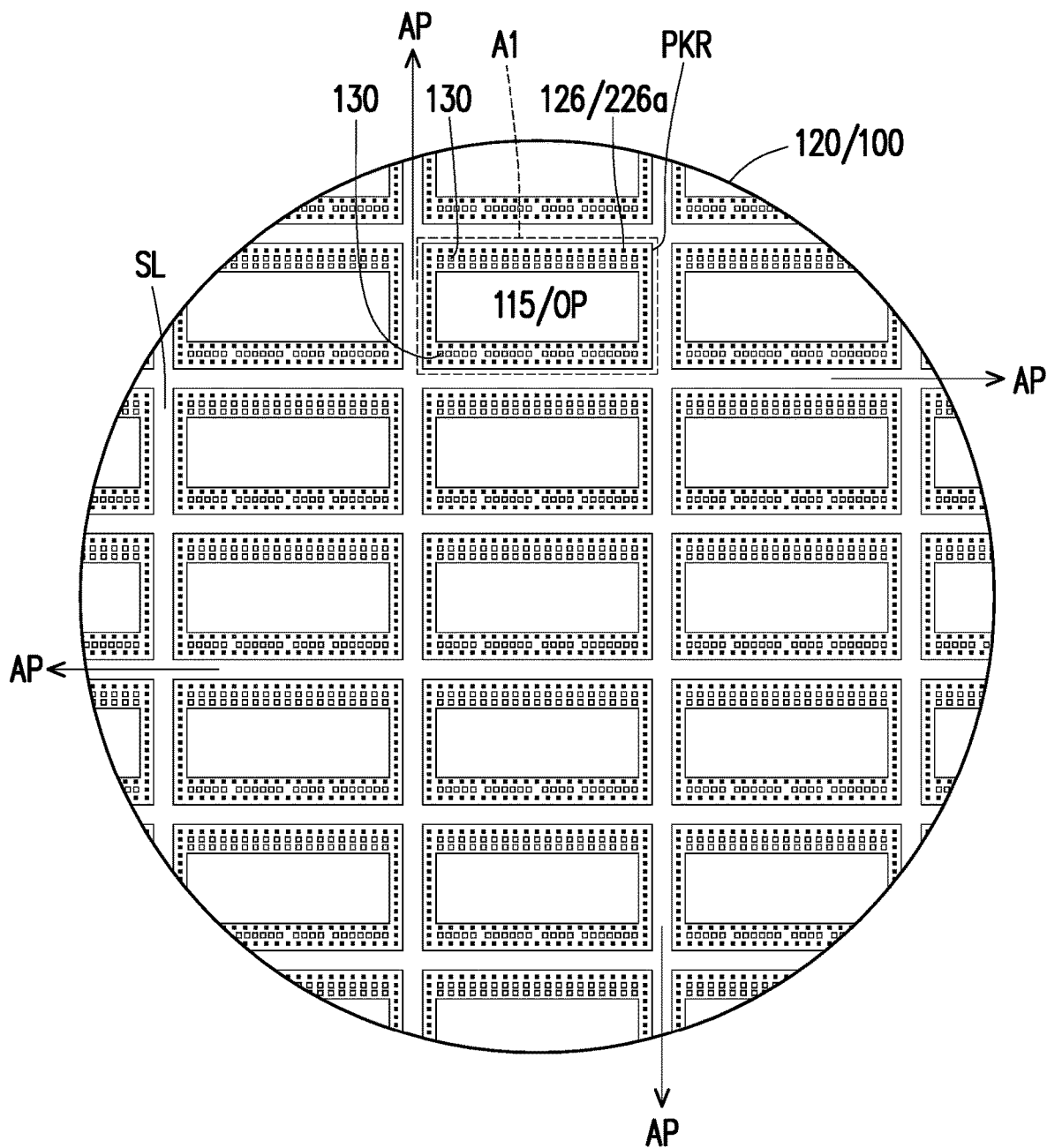
FIG. 3A is a top view of FIG. 1H.
Figure 3B:
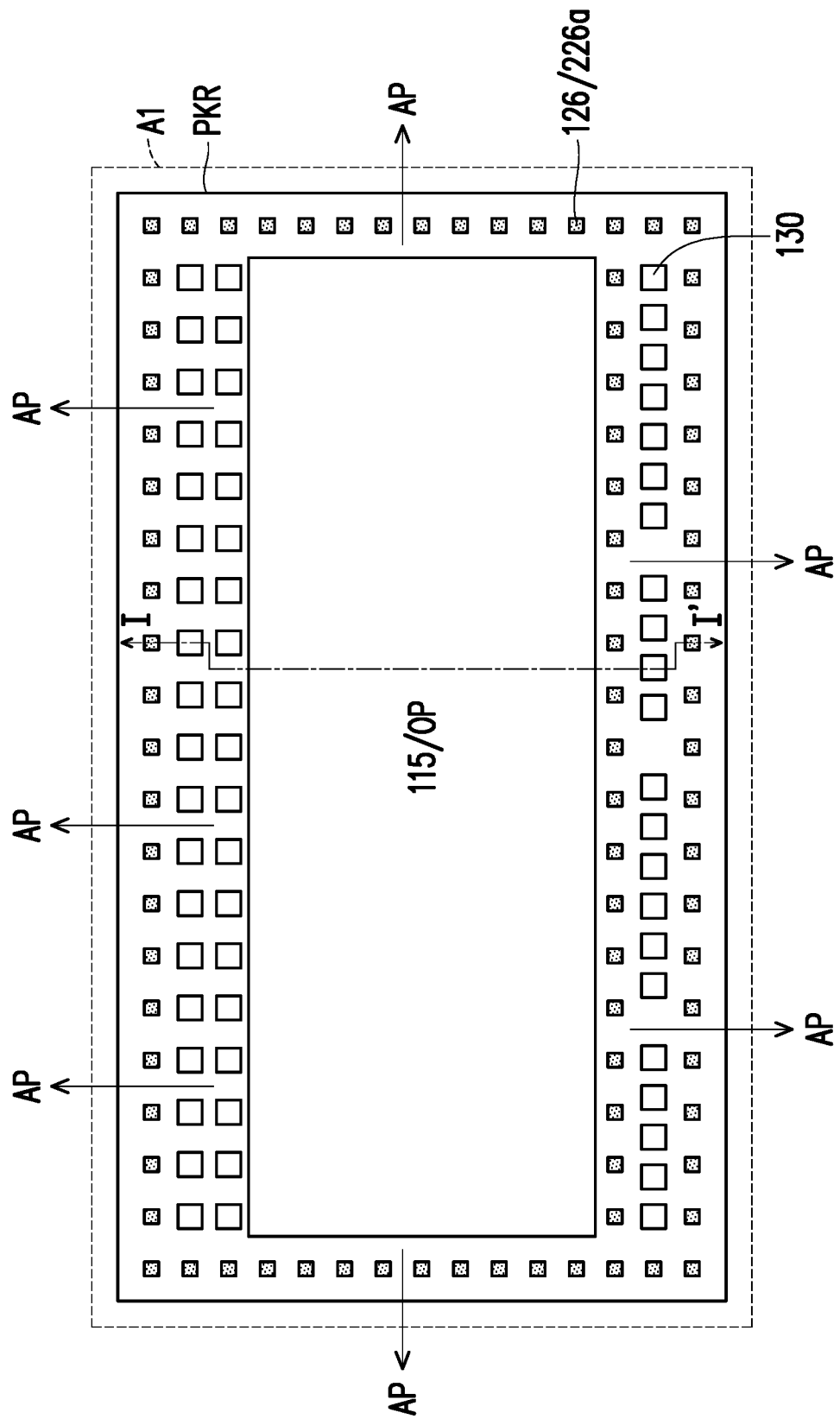
FIG. 3B is an enlarged view of a region in FIG. 3A.

FIG. 3A is a top view illustrating a distribution of the dummy items 126 on the RDL structure 120 over the carrier 100. FIG. 3B is an enlarged view of a region A1 of FIG. 3A. FIG. 1H is a cross-sectional view taken along I-I' line of FIG. 3B. Referring to FIG. 1H, FIG. 3A and FIG. 3B, in some embodiments, a plurality of package regions PKR are disposed over the carrier 100. The package regions PKR are the regions within which package structures are to be formed. The package regions PKR are spaced apart from each other by scribe lines (or referred to as scribe regions) SL therebetween. FIG. 3B illustrates a top view of one of the plurality of package regions PKR, and FIG. 1H illustrates a cross-sectional view of an intermediate package structure formed in one of the plurality of package regions PKR. In some embodiments, the structures formed in different package regions PKR are substantially the same or similar.

In some embodiments, the dummy items 126 are formed within package regions PKR and are not formed in the scribe regions SL, but the disclosure is not limited thereto. When viewed in a top view, the dummy items 126 may be square as shown in FIG. 3A and FIG. 3B, but the disclosure is not limited thereto. The top views of the dummy items may also be rectangular, circular, oval, or any other suitable shaped. In some embodiments, the plurality of dummy items 126 are arranged in an array including a plurality of rows and columns. Alternatively, the dummy items 126 may be randomly arranged over the RDL structure 120. In some embodiments, each of the passive devices 130 has one or more dummy item 126 disposed adjacent thereto, but the disclosure is not limited thereto. In some embodiments, the dummy items 126 may be aligned with or staggered with the passive devices 130 in a same row or column. In some embodiments, some of the dummy items 126 may be disposed at edge portions of the package region PKR and may be arranged as a ring. In some embodiments, some of the dummy items 126 may be arranged at or close to center portions of the package region PKR and may surround the opening OP. It is noted that, the distribution of the dummy items 126 shown in FIG. 3A and FIG. 3B is merely for illustration, and the disclosure is not limited thereto. The advantages of the dummy items 126 will be described below.

Figure 1I:
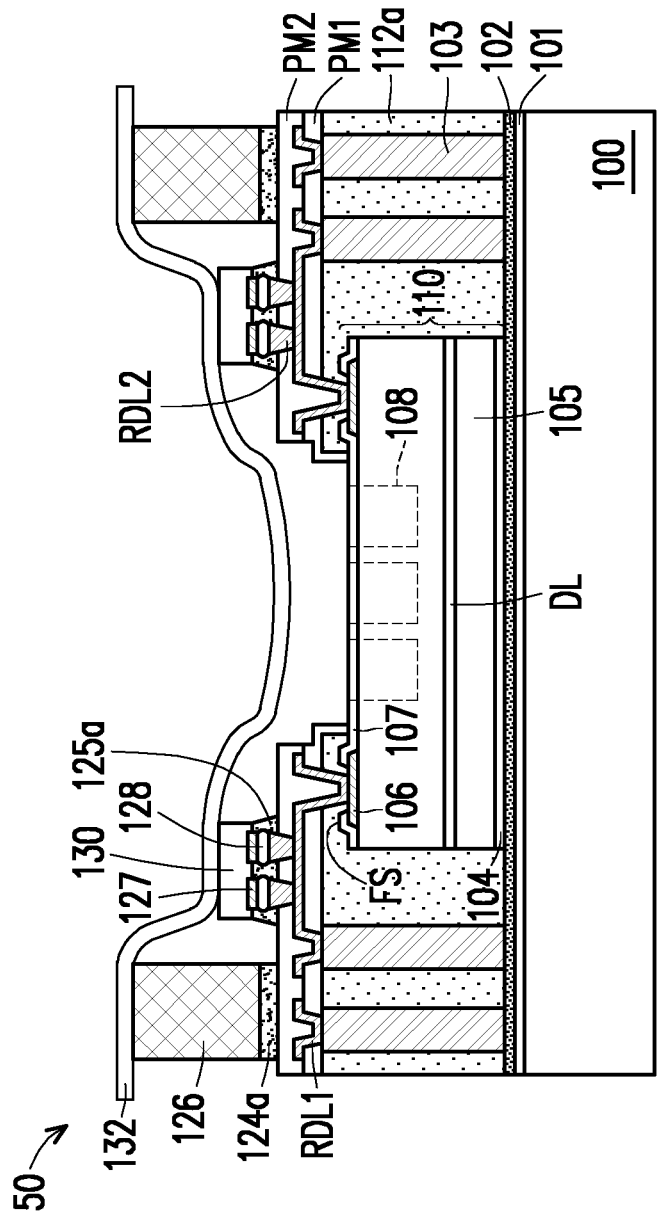

Referring to FIG. 1I, a tape 132 is placed on the intermediate structure 50 formed in FIG. 1H. The tape 132 is an adhesive tape for attaching the structure 50 to a table in subsequent processes. In some embodiments, the tape 132 is a soft tape and its shape on the structure 50 is dependent on the components attached thereto. In some embodiments, the dummy pillars 126 are configured to lift/support the tape 132 to prevent the tap 132 from sealing the intermediate structure 50.

Referring to FIG. 1I, FIG. 3A, and FIG. 3B, the tape 132 is in contact with the dummy items 126 and may partially contact the passive devices 130. In the embodiments, the number of dummy items 126 is sufficient enough to lift the tape 132, thereby preventing the tape 132 from completely sealing the intermediate structure 50. Further, sufficient height and width of the dummy items may also help to lift the tape 132. As a result, a space between the tape 132 and the intermediate structure 50 is in spatial communication with the outer atmosphere (such as atmosphere in a process chamber) that is out of the space. Therefore, the dummy items 126 create air paths allowing the airs in the space between the tape 132 and the structure 50 to flow out of the space, for example, during subsequent process where the process chamber need to be vacuumed, some of the air paths are schematically and illustratively shown as the arrows AP in FIG. 3A and FIG. 3B. In some embodiments, the passive devices 130 also help to create the air paths. The number, sizes, and distribution of the dummy items 126 are not limited to that are shown in FIG. 3A and FIG. 3B, as long as the dummy items 126 can lift the tape 132 to create the air path.

Referring to FIG. 1I, in some embodiments, the tape 132 may be separated (e.g., completely separated) from the top surface of the polymer layer PM2. the sidewalls of the RDL structure 120 and/or the front surface FS of the die 110. In some other embodiments, the tape 132 may also have a small portion that is in contact with the polymer layer PM2 and/or the front surface FS of the die 110, as long as air between the tape 132 and the intermediate structure 50 is not sealed, and there has air path for air between the tape 132 and the intermediate structure 50 to flow out.

Figure 1J:
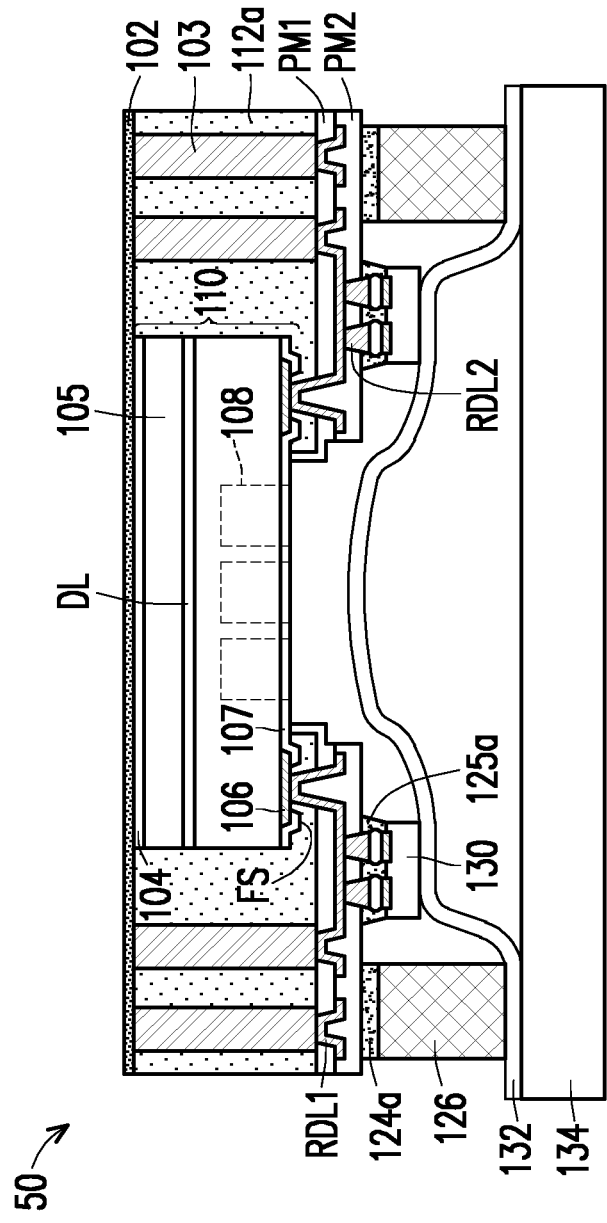

Referring to FIG. 1I and FIG. 1J, the intermediate structure 50 is flipped upside down and attached to a table 134 through the tape 132. The table 134 may be a stage (e.g., wafer stage) or a platform in a chamber of process tool. Thereafter, the carrier 100 is de-bonded from the intermediate structure 50. In some embodiments, the de-bonding layer 101 is decomposed under the heat of light, and the carrier 100 is then released. After the carrier 100 is released, the dielectric layer 102 is exposed.

Figure 1K:
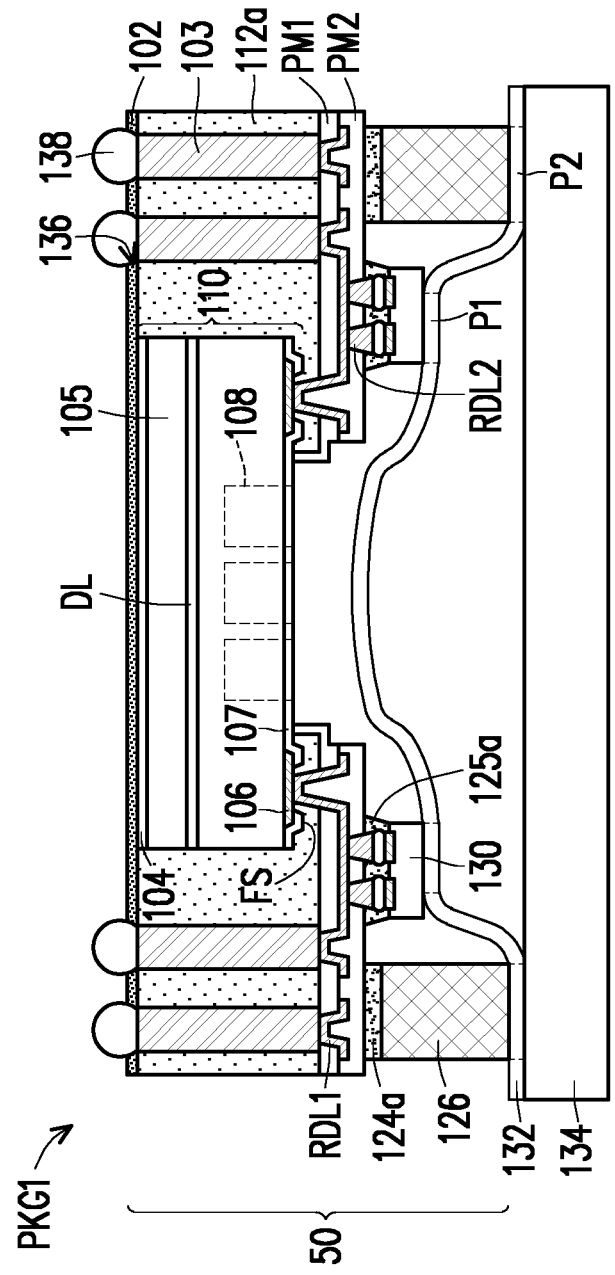

Referring to FIG. 1K, in some embodiments, the dielectric layer 102 is then patterned to form a plurality of openings 136 therein. The openings 136 penetrate through the dielectric layer 102 and expose the plurality of conductive vias 103. In some embodiments, the patterning of the dielectric layer 102 includes performing a laser drilling process to remove portions of the dielectric layer 102 directly over the conductive vias 103. Thereafter, a plasma cleaning process is performed to clean the surfaces of the dielectric layer 102 and/or the exposed conductive vias 103. In some embodiments, before performing the plasma cleaning process, the process chamber may be vacuumed, during which airs in the space between the tape 132 and the intermediate structure 50 may flow out of the space through the above-described air paths (shown as arrows AP in FIG. 3A and FIG. 3B) created by the dummy items 126.

Still referring to FIG. 1K, after the plasma cleaning process is performed, a plurality of connectors 138 are formed on the dielectric layer 102 and filling into the openings 136 to electrically connected to the conductive vias 103. The connectors 138 may be conductive balls, micro bumps, or the like, or combinations thereof. In some embodiments, the connectors 138 are solder balls formed by a suitable technique, such as ball mounting process, or a printing process followed by a reflow process. The connectors 138 are electrically connected to the die 110 through the conductive vias 103 and the RDL structure 120.

Still referring to FIG. 1K, during the above processes where the intermediate structure 50 is placed on the table 134, the tape 132 is disposed between the intermediate structure 50 and the table 134, and in contact with the dummy items 126 and the passive devices 130. In some embodiments, portions P1 of the tape 132 attaching to the passive devices 130 are not in contact with the table 134 and are separated from the table 134 by a non-zero distance, while portions P2 of the tape 132 are disposed between and in physical contact both of the dummy items 132 and the table 134.

The configuration of the dummy items 126 has various advantages. In the embodiments, since the dummy items 126 create air paths allowing the airs between the tape 132 and the structure 50 to flow out, airs in the space between the tape 132 and the structure 50 are in spatial communication with the outer atmosphere in the process chamber, that is, the air pressure between the tape 132 and the structure 50 is substantially the same as the outer atmospheric pressure. As such, a plurality of potential issues might happen during the vacuuming and plasma process can be prevented. For example, if there has no dummy item formed on the RDL structure 120 to create the air path, the tape 120 may seal the structure 50. In other words, the air in the space between the tape 132 and the structure 50 may be sealed and cannot flow out. As such, during the vacuuming process, the sealed air between the tap 132 and the structure 50 intended to flow out may push the tape and tape arcing issue may happen. Protrusions or tips may be formed in the tape 132 when pushed by the sealed air, or the tape 132 may be broken by the sealed air intended to flow out. The protrusions or tips or broken portions of the tape 132 may also be referred to as defect regions of the tape 132. Thereafter, during the plasma cleaning process, the defect regions of the tape 132 are prone to be heated by the plasma or react with the plasma, which may cause the tape to burn or damage, thereby adversely affecting the performing of the subsequent processes. In the embodiments of the disclosure, since the dummy items 126 are formed to create the air paths, the above-described issues are prevented.

On the other hand, through forming the dummy items 126 higher than the passive devices 130, the dummy items 126 are closer to the table 134 than the passive devices 130, and the passive device 130 is not directly attached to the table 134 through the tape 132. Instead, the passive device 130 with the tape 132 attached thereon overhangs the table 134 and separate from the table 134 by non-zero distance, which may avoid the stress applied on the passive devices 130 from the table 134, thereby protecting the passive devices 130 from being damaged.

Figure 1L:
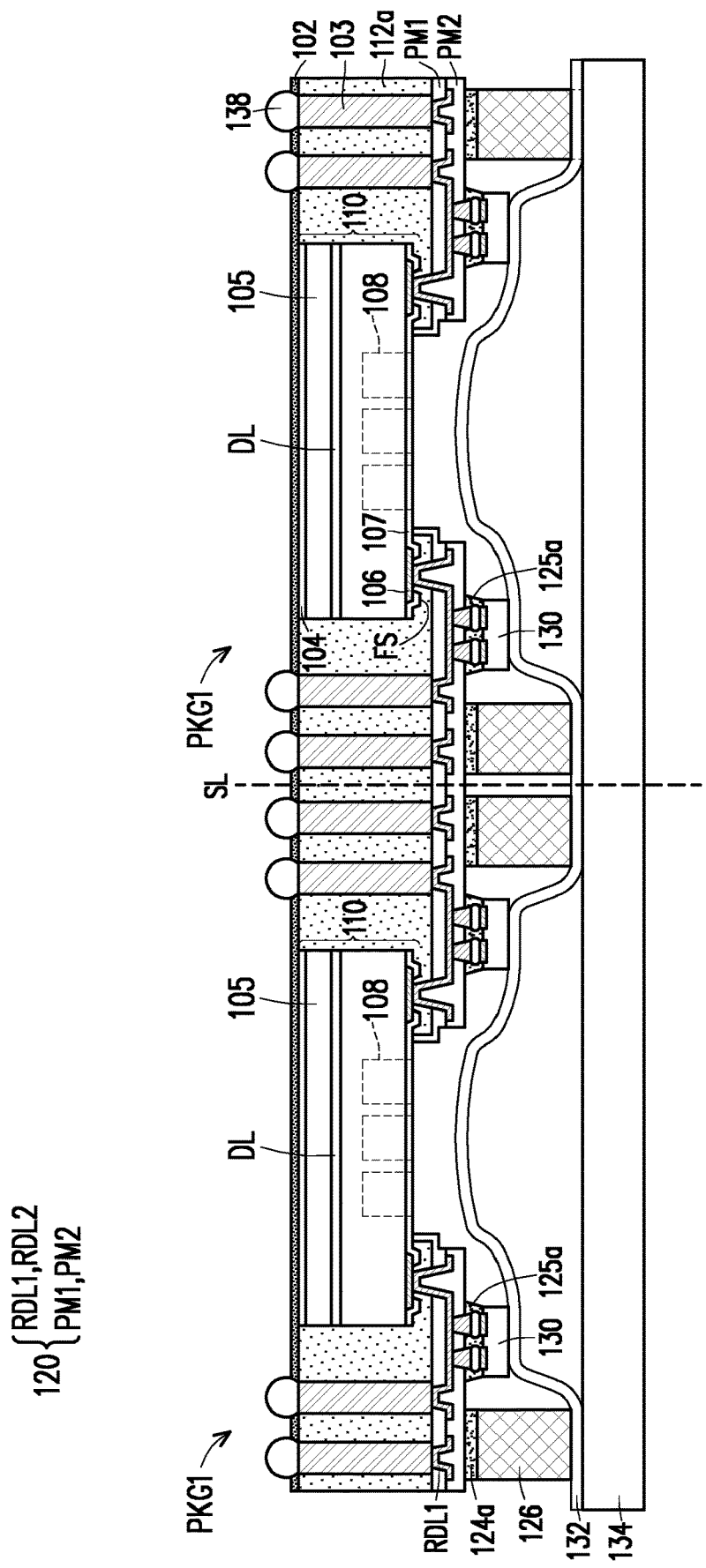

As such, a plurality of package structures PKG1 are thus formed in the plurality of package regions PKR (FIG. 3A). It is noted, FIG. 1A to FIG. 1K shows the formation of one package structure PKG1 for illustration. It should be understood that a plurality of package structures PKG1 are formed side by side over the table 134, as shown in FIG. 1L and FIG. 3A. The number of the package structures PKG1 that are formed is not limited in the disclosure.

Referring to FIG. 1L, a singulation process is then performed to separate the package structures PKG1 through the scribe lines SL. The singulation process may include a die saw process, a laser dicing process, the like or combinations thereof.

Figure 1M:
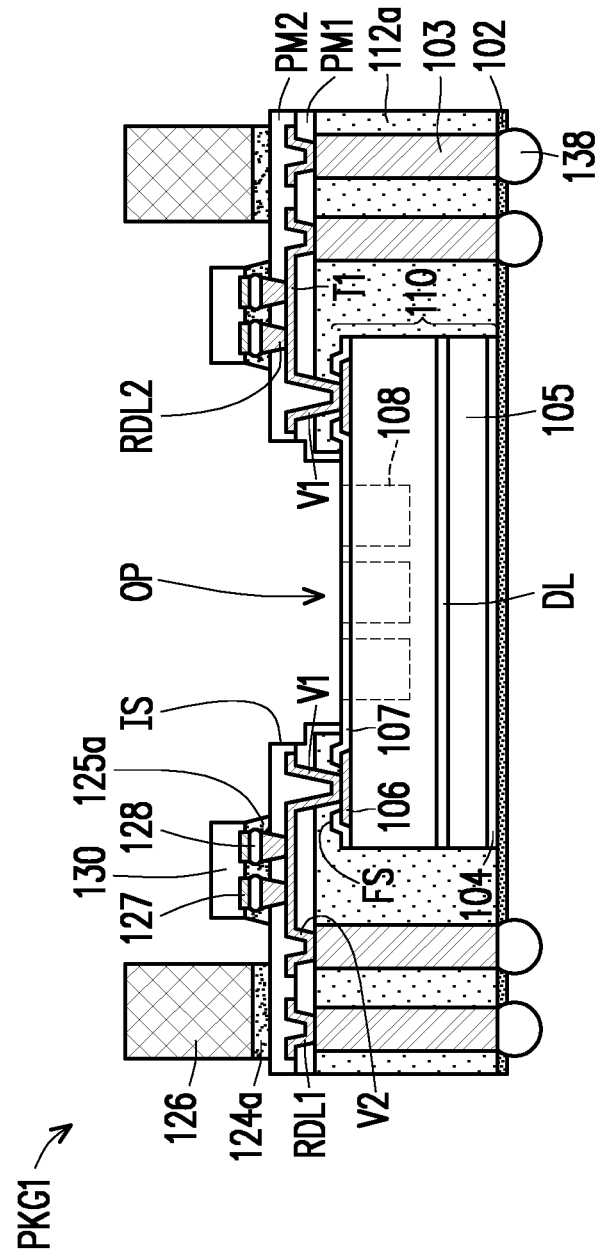

Referring to FIG. 1L and FIG. 1M, the singulated package structure PKG1 is removed from the table 134, and the tape 132 is removed. As such, the fabrication of the package structure PKG1 is completed.

Referring to FIG. 1M, in some embodiments, the package structure PKG1 includes the die 110, the conductive vias 103, the encapsulant 112a, the RDL structure 120, the passive devices 130 and the dummy items 126. The conductive vias 103 are disposed laterally aside the die 110. The encapsulant 112a encapsulates sidewalls of the die 110 and the conductive vias 103 and may further encapsulate a portion of the first surface FS of the die 110. The dummy items 126 are attached to the polymer layer PM1 through the adhesive layers 124a. The passive devices 130 are electrically bonded to the redistribution layer RDL2 of the RDL structure 120. The top surfaces of the dummy items 126 are higher than the top surfaces of the passive devices 130. Some of the dummy items 126 may formed on edge portions of the RDL structure 120, some of the dummy items 126 are formed on middle portions and center portions of the RDL structure 120 surrounding the opening OP.

FIG. 4A to FIG. 4I are cross-sectional views illustrating a method of forming a package structure according to some other embodiments of the disclosure. Like elements are designated with the same reference numbers for ease of understanding and the details thereof are not repeated herein.

Figure 4A:
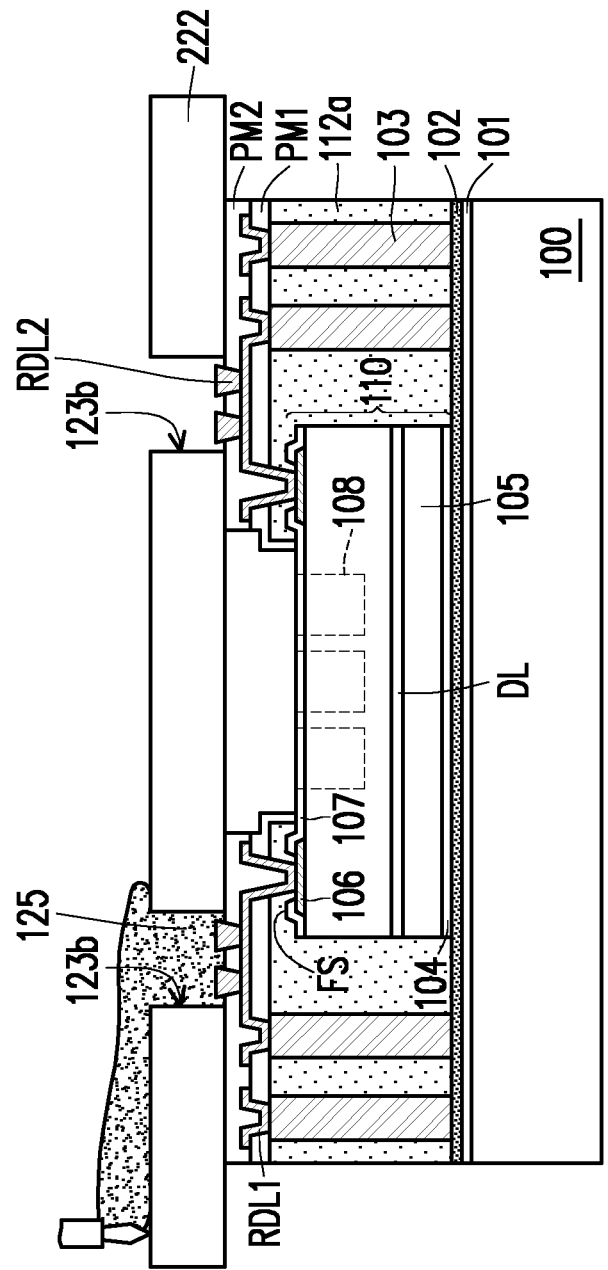
FIG. 4A to FIG. 4I are schematic cross-sectional views illustrating a method of forming a package structure according to some other embodiments of the disclosure.

Referring to FIG. 4A, in some embodiments, after the RDL structure 120 is formed, a stencil 222 is placed onto the RDL structure 120. The stencil 222 is different from the stencil 122 illustrated in FIG. 1G. In some embodiments, the stencil 222 only has openings 123b for exposing the redistribution layers RDL2 and portions of the polymer layer PM2 adjacent to the redistribution layers RDL2, and does not have the openings 123a (FIG. 1G). A first printing process is performed using the stencil 222, so as to apply flux material 125 onto the RDL structure 120 exposed by the stencil 222.

Figure 4B:
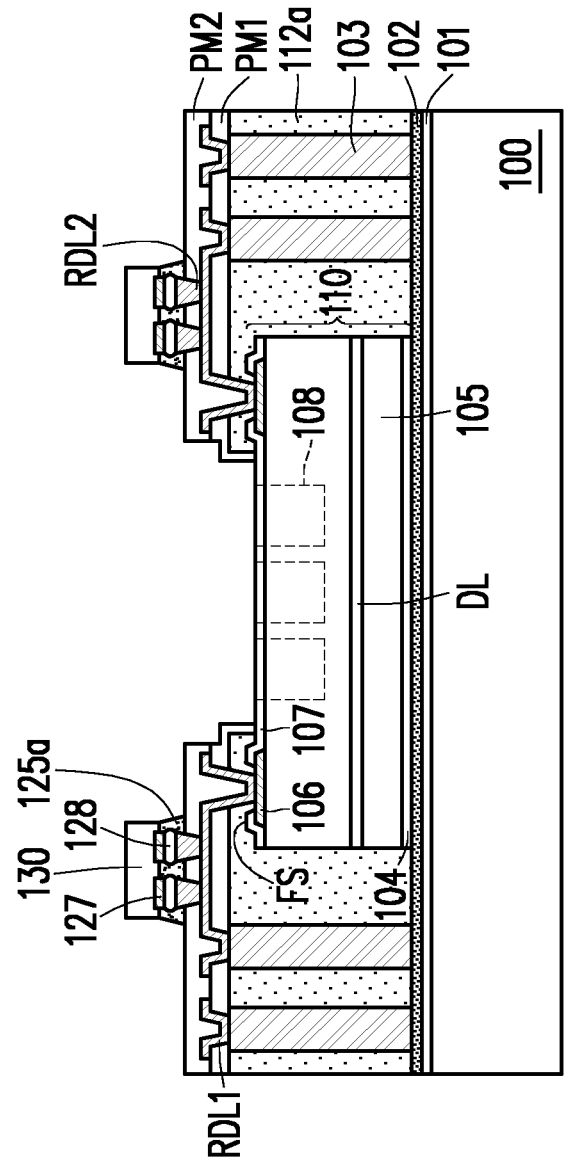

Referring to FIG. 4A and FIG. 4B, after the flux materials 125 are applied into the openings 123b, the stencil 222 is removed. A plurality of passive devices 130 are mounted on the RDL structure 120 by electrically bonding the connectors 128 to the redistribution layers RDL2. The mounting process is substantially the same as those described with respect to FIG. 1H, which is not described again here. Similar to the foregoing embodiments, a portion of the flux material 125 is reacted during reflow process, and the flux residue is remained between the passive device 130 and the RDL structure 120 to serve as the filling layer 125a.

Figure 4C:
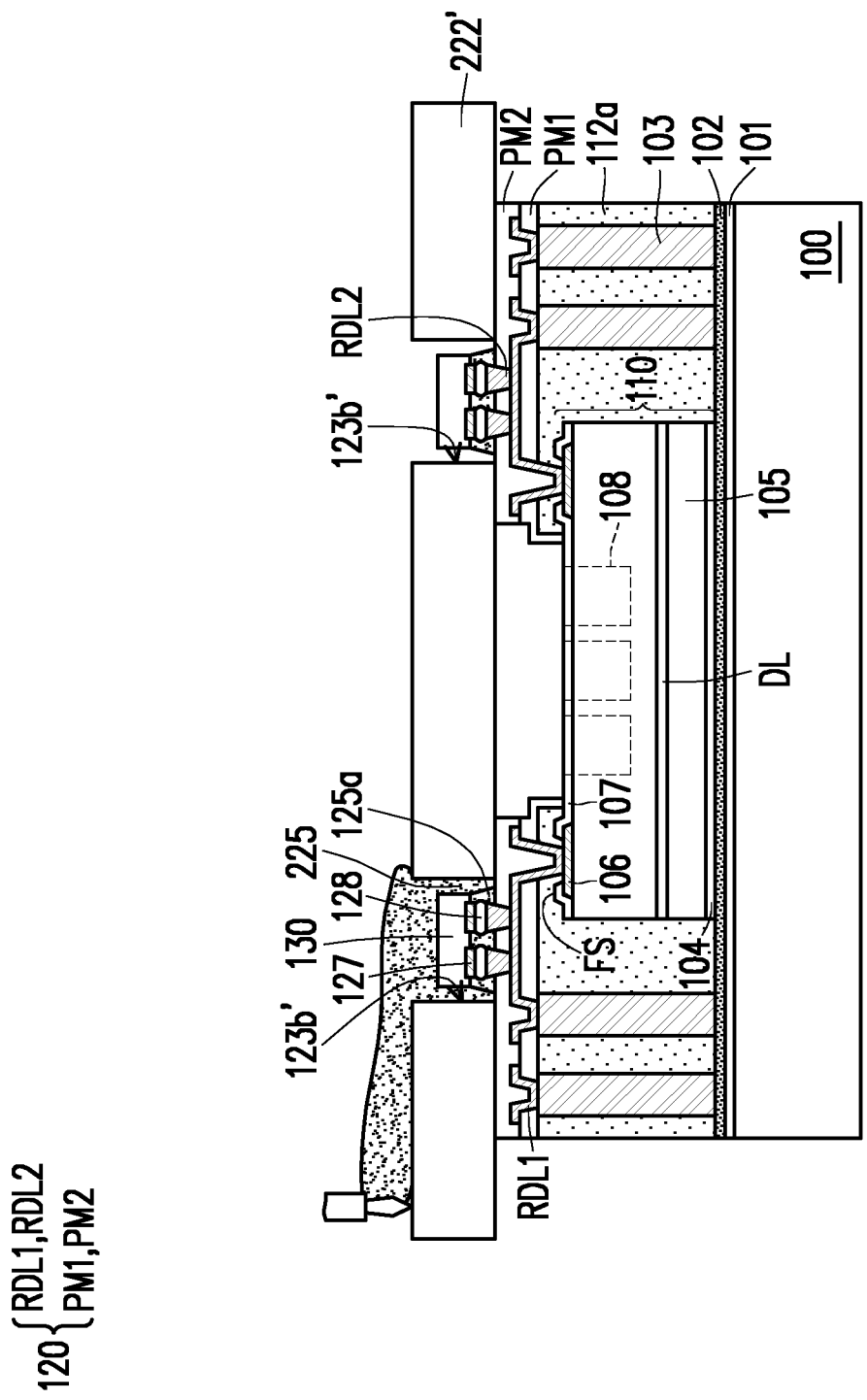

Referring to FIG. 4C, a stencil 222' is placed on the RDL structure 120 for a second printing process. The stencil 222' may be the same as or different from the stencil 222. The stencil 222' has openings 123b' exposing the passive devices 123 on the RDL structure 120. The size of opening 123b' may be substantially the same as or larger than the size of the opening 123b. If the size of the opening 123b' is the same as that of the opening 123b. A same stencil may be used for the first and second printing processes.

The second printing process is performed to apply a protection material 225 on the RDL structure 120 exposed by the stencil 222', so as to cover the passive devices 130.

In some embodiments, the protection material 225 covers (e.g., completely covers) the top surfaces and sidewalls of the passive devices 130. In some embodiments, the protection material 225 may be the same as or different from the flux material 125.

Figure 4D:
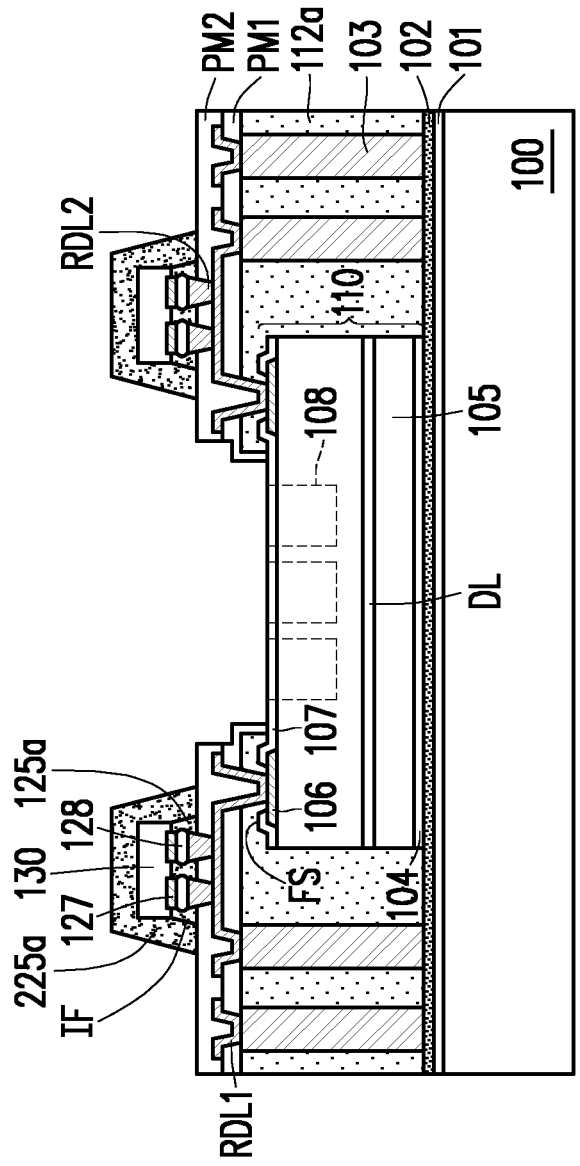

Referring to FIG. 4C and FIG. 4D, the stencil 222' is removed, and a curing process is performed to cure the protection material 225, thereby forming a protection layer 225a. In some embodiments, the curing process may cause the shape change of the protection material, but the disclosure is not limited thereto. As shown in FIG. 4D, the protection layer 225a cover top surfaces and sidewalls of the passive devices 130 and sidewalls of the filling layer 125a. An interface IF may be existed between the flux material 125a and the protection layer 225a.

Figure 4E:
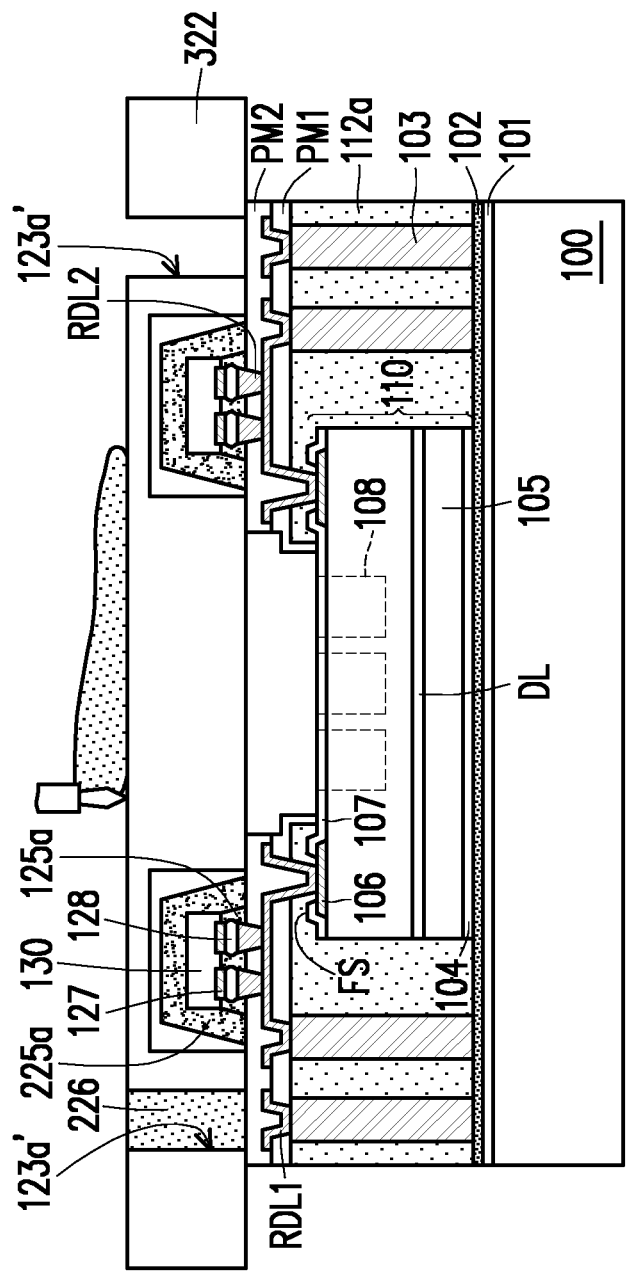
Figure 4F:
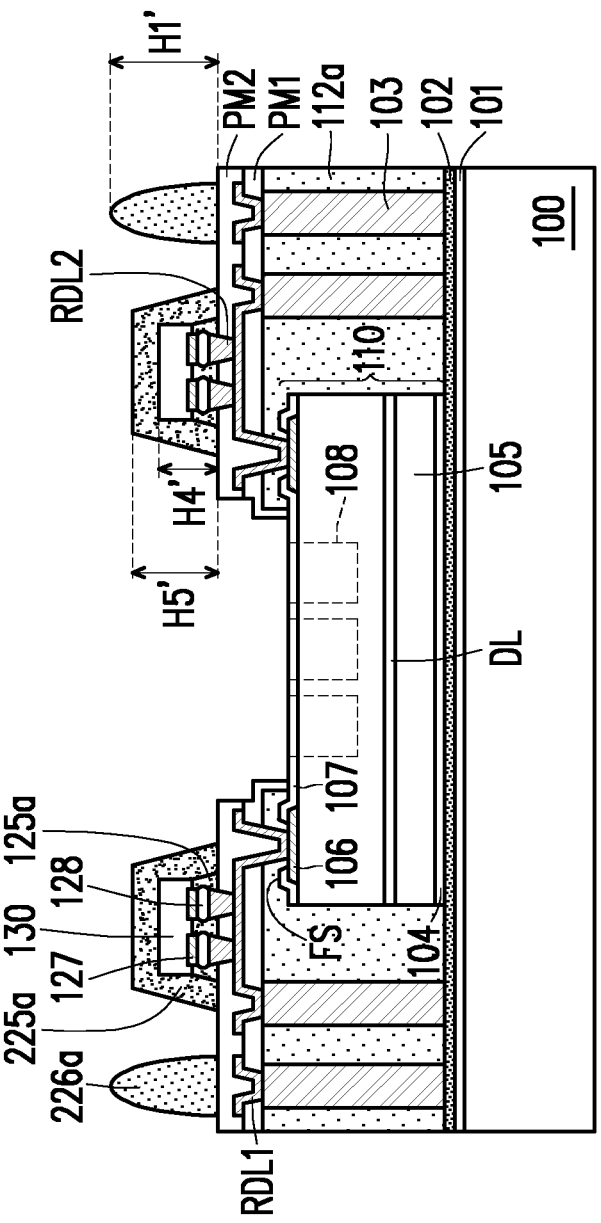

Referring to FIG. 4E and FIG. 4F, in some embodiments, a third printing process is performed to form dummy items 226a on the RDL structure 120. Referring to FIG. 4E, a stencil 322 is placed on the RDL structure 120, the passive devices 130 are covered by the stencil 322. The stencil 322 has openings 123a' for exposing portions of the top surface of the polymer layer PM2 of the RDL structure 120. The locations of the openings 123a' are substantially the same as those of those of the openings 123a (FIG. 1G). Thereafter, the third printing process is performed using the stencil 322 to apply dummy materials 226 on the RDL structure 120 exposed by the stencil 322. The dummy materials 226 may include molding compound material. The molding compound material may include a base material (such as polymer material) and a plurality of fillers distributed in the base material. The fillers may include silicon oxide, aluminum oxide, boron nitride, alumina, silica, or the like, or combinations thereof. The cross-section shape of the filler may be circle, oval, or any other suitable shape. In alternative embodiments, the dummy materials 226 may include a polymer material free of fillers therein. The polymer material may include PBO, PI, BCB, or the like, or combinations thereof. In yet another embodiment, the dummy materials 226 may include a resin such as epoxy, but the disclosure is not limited thereto. Other suitable materials may also be used as the dummy materials 226. In some embodiments, the dummy materials 226 may be the same as or different from the material of the encapsulant 112a.

Referring to FIG. 4F, a curing process is then performed to cure the dummy materials 226, so as to form a plurality of dummy items 226a on the RDL structure 120. The locations of the dummy items 226a are substantially the same as the locations of the dummy items 126 described in the foregoing embodiment. In some embodiments, compared to the shape of the dummy materials 226, the shape of the dummy item 226a may be deformed after the curing process. For example, the top of the dummy item 226a may be rounded. In some embodiments, the width of the dummy item 226a gradually decreases from bottom to top. In some other embodiments, other suitable processes, such as molding process may also be used to form the dummy items 226a, and the dummy items 226a may be formed to have a substantially planar top surface and substantially uniform width from bottom to top.

In some embodiments, the height H1' of the dummy item 226 defined from a topmost point (or topmost surface) of the dummy item 226 to a bottom surface of the dummy item 226 or a top surface of the polymer layer PM2 is larger than the height H4' defined from the top surface of the passive device 130 to the top surface of the polymer layer PM2 of the RDL structure 120, and larger than the height H5' defined from the top surface of the protection layer 225a to the top surface of the RDL structure 120, but the disclosure is not limited thereto. In alternative embodiments, the height H1' may be larger than the height H4' and less than or substantially equal to the height H5'. In yet alternative embodiments, the height H1' may be less than or substantially equal to the height H4'. In other words, in some embodiments, the topmost point or topmost surface of the dummy item 226a may be higher than the top surfaces of the protection layer 225a and the passive device 130. In alternative embodiments, the topmost point/surface of the dummy item 226a may be higher than the top surface of the passive device 130 and lower than or substantially coplanar with the top surface of the protection layer 225a. In yet alternative embodiments, the topmost point/surface of the dummy item 226a may be lower than or substantially coplanar with the top surface of the passive device 130.

Figure 4G:
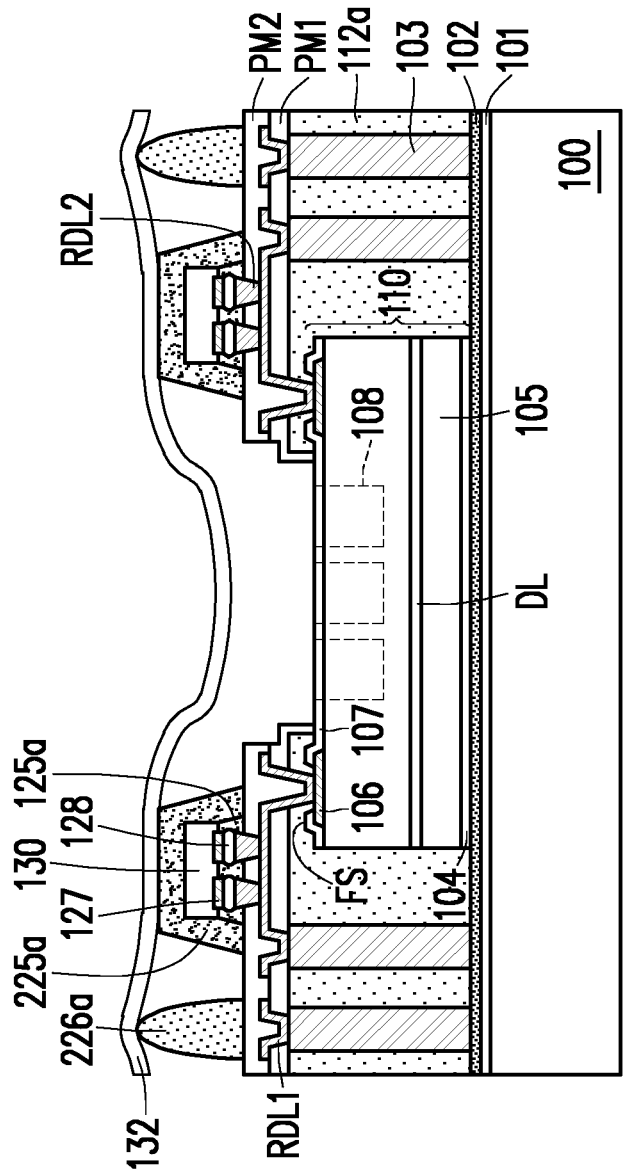
Figure 4H:
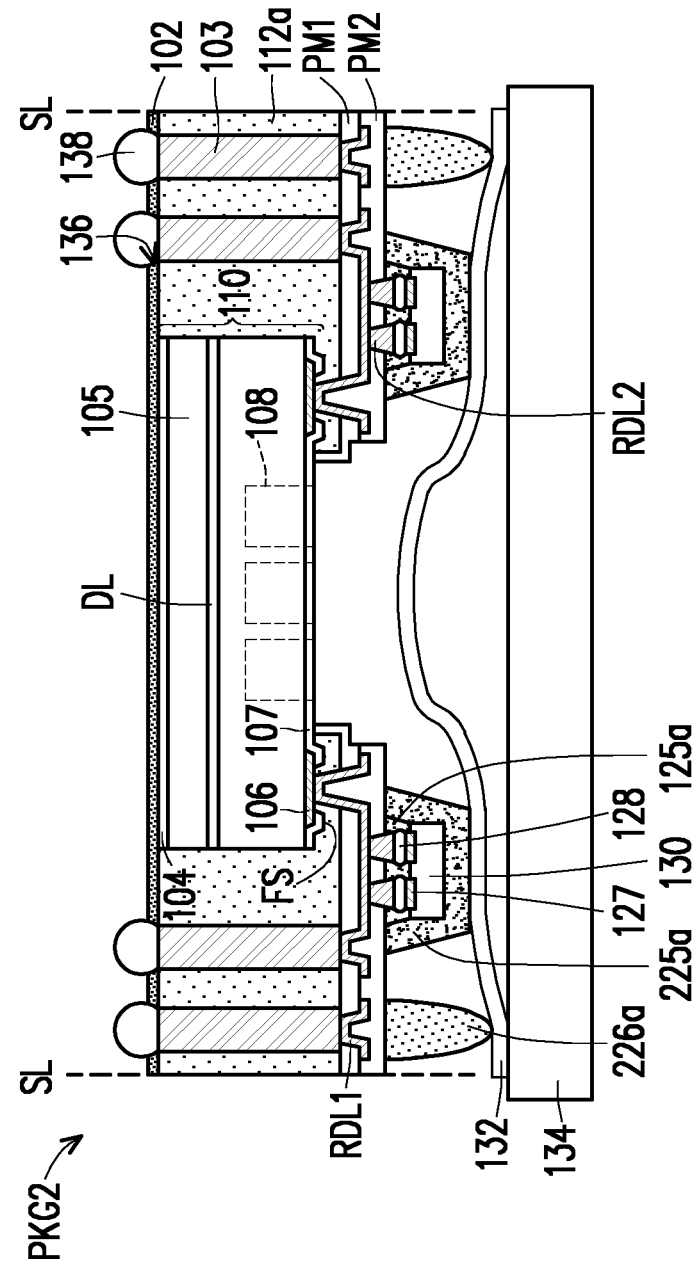
Figure 4I:
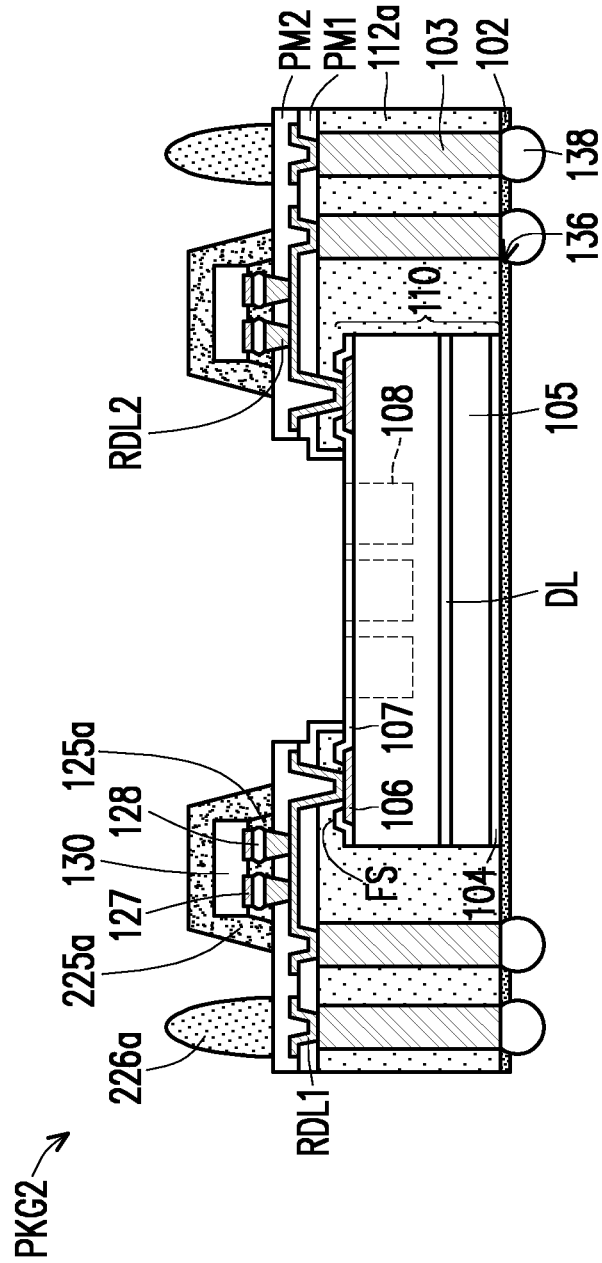

Referring to FIG. 4G to FIG. 4I, processes similar to those described in FIG. 1H to FIG. 1M are then performed to form a package structure PKG2.

Referring to FIG. 4G, a tape 132 is attached to the intermediate structure 50' formed in FIG. 4F. Similar to the foregoing embodiment, the dummy items 226a lift the tape 132, such that the space between the tape 132 and the intermediate structure 50' is in spatial communication with the outer atmosphere in the process chamber, thereby creating an air path allowing the air in the space between the tape 132 and the intermediate structure 50' to flow out when the process chamber need to be vacuumed. In some embodiments, the passive device 130 with protection layer 225a thereon may also help to create the air path.

Referring to FIG. 4H, the intermediate structure 50' is flipped upside down and attached to a table 134 through the tape 132. Thereafter, the carrier 100 is released to expose the dielectric layer 102. A plurality of openings 136 are formed in the dielectric layer 102 by, for example, laser drilling process, so as to expose the conductive vias 103. A plasma cleaning process is then performed to clean the surfaces of the dielectric layer 102 and the conductive vias 103. In some embodiments, before the plasma cleaning process, the process chamber is vacuumed, during which the air in the space between the tape 132 and the intermediate structure 50' may flow out through the air path created by the dummy items 226a and/or the passive devices 130, thereby avoiding the above-described issues that may happen in plasma cleaning process.

In the present embodiments, the dummy items 226a may also help to protect the passive device 130 from the damage that may be caused by the stress from the table 134 if the dummy items 226a are formed to be higher than the passive device 130 with protection layer 225a (i.e., the dummy items 226a are more closer to the table 134 than the passive device 130 to the table 134) in FIG. 4F. Further, the protection layer 225a provides double protection for the passive device 130. In some embodiments, even the height of dummy item 226a is formed to be not high enough in FIG. 4F, such as lower than the protection layer 225a or even lower than the passive device 130 (i.e., the passive device 130 with the protection layer 225a is more closer to the table 134 than the dummy item 226a to the table 134), the passive device 130 can still be protected by the protection layer 225a. The protection layer 225a may help to reduce or avoid the stress being applied on the passive device 130 from the table 134. In other words, the protection layer 225a serves as a buffer layer to reduce the stress.

Still referring to FIG. 4H, a plurality of connectors 138 are formed on the conductive vias 103 exposed by the dielectric layer 102. As such, a package structure PKG2 is thus formed, and a singulation process may be performed along scribe lines SL to singulate the package structure PKG2.

Referring to FIG. 4H and FIG. 4I, the singulated structure PKG2 is removed from the table 134 and the tape 132 is removed. Referring to FIG. 4I, in some embodiments, the package structure PKG2 includes the die 110, the encapsulant 112*a*, the conductive vias 103, the RDL structure 120, the passive devices 130, the dummy items 226*a* and the connectors 138. In some embodiments, the dummy item 226*a* is in physical contact with the polymer layer PM2 of the RDL structure 120. The material of the dummy item 226*a* may be the same as the material of the encapsulant 112*a*, but the disclosure is not limited thereto. A filling layer 125*a* is formed to fill the space between passive device 130 and the RDL structure 120, and a protection layer 225*a* is disposed on the RDL structure 120 to cover the passive device 130 and/or the filling layer 125*a*. The other structural features of the present embodiment are substantially the same as those described in the foregoing embodiment, which are not described again here. It is noted that, the protection layer 225*a* and/or dummy items 226*a* may also be applied in other embodiments described herein.

Figure 5:
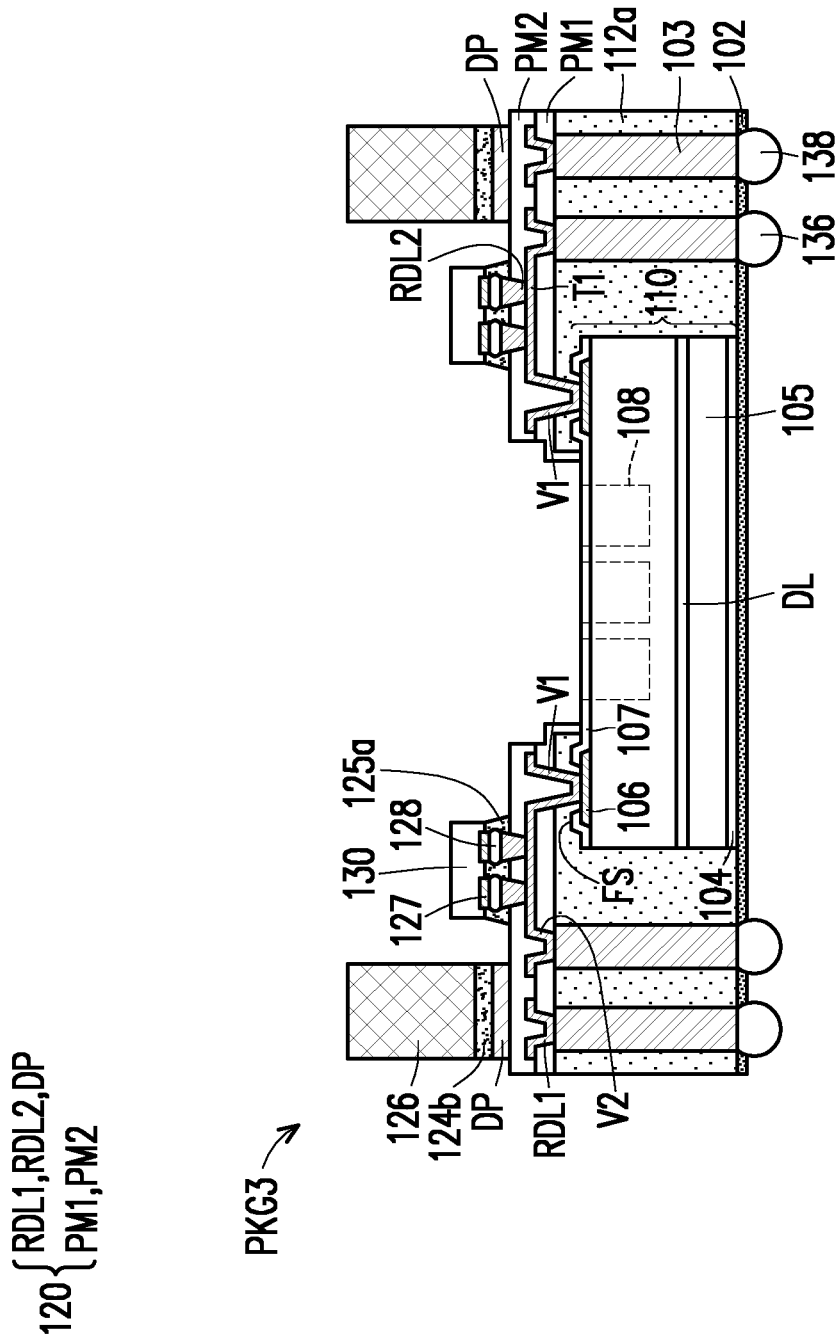
FIG. 5 is a schematic cross-sectional view illustrating a package structure according to alternative embodiments of the disclosure.

FIG. 5 is a cross-sectional view illustrating a package structure PKG3 according to some other embodiments of the disclosure. The embodiment of the FIG. 5 is similar to the foregoing embodiments, except that the RDL structure 120 further includes dummy features.

Referring to FIG. 5, in some embodiments, the RDL structure 120 further includes a plurality of dummy pads or dummy connectors DP. The dummy pads DP are formed on the top surface of the polymer layer PM2 and may include a conductive material that are similar to, the same as or different from those of the redistribution layers RDL1 and RDL2. The dummy pads DP and the redistribution layer RDL2 may be formed simultaneously or successively. In the embodiments, the dummy pads DP are electrically floating, that is, electrically isolated from the redistribution layers RDL1 and RDL2. The dummy pads DP are disposed for bonding the dummy items 126.

For example, the bonding of the dummy items 126 to the dummy pads DP may include the flowing processes: in the process shown in FIG. 1G, the flux material 124 is applied onto the dummy pads DP exposed by the opening of the stencil. Thereafter, dummy items 126 are placed onto the dummy pads DP, during which portions of the flux material 124 may be pushed outward to surround the dummy pad DP and/or the dummy item 126. A reflow process is then performed during which a portion of the flux material 124 may be reacted with the dummy item 126 and/or the dummy pad DP, while the unreacted flux reside may be remained to form an adhesive layer (or referred to as a protection layer) 124*b* disposed between and/or laterally surround the dummy pad DP and/or the dummy item 126.

FIG. 6A to FIG. 6D illustrate various examples of the dummy items 126 bonding to dummy pads DP.

Referring to FIGS. 6A to 6D, in some embodiments, the dummy item 126 may be in physical contact with the dummy pads DP, and the adhesive layer 124*b* may cover the sidewalls of the dummy pads DP and/or the sidewalls of the dummy item 126.

FIG. 7 illustrates a cross-sectional view of a package structure PKG4 according to yet another embodiment of the disclosure. The present embodiment is similar to the foregoing embodiment, except that the encapsulant 112*a* does not cover the first surface FS of the die 110.

Referring to FIG. 7, as described above in FIG. 1B to FIG. 1F, in some embodiments, the sacrificial layer 109 may be formed to cover the entire surfaces of the passive layer 107 and the conductive pads 106 of the die 110, and the encapsulant 112*a* may be formed laterally aside the die 110 without covering the first surface FS of the die 110. In such an embodiment, more portions of the RDL structure may be formed to cover the first surface FS the die 110 and laterally surrounded by the encapsulant 112*a*. For example, a portion of the polymer layer PM1 is formed to cover and physically contact portions of the top surfaces of the passivation layer 107 and the conductive pads 106. The conductive via V1 may merely penetrate through the polymer layer PM1 to connect to the conductive pads 106. The other features of the package structure PKG4 are substantially the same as those of the package structure PKG1 described in FIG. 1M, which are not described again here.

In accordance with some embodiments of the disclosure, a package structure includes a die, an encapsulant, a redistribution layer (RDL) structure, a passive device, and a plurality of dummy items. The encapsulant laterally encapsulates the die. The RDL structure is disposed on the die and the encapsulant. The passive device is disposed on and electrically bonded to the RDL structure. The plurality of dummy items are disposed on the RDL structure and laterally aside the passive device, wherein top surfaces of the plurality of dummy items are higher than a top surface of the passive device.

In accordance with alternative embodiments of the disclosure, a package structure includes a die, an encapsulant, a RDL structure, a passive device, a protection layer and a plurality of dummy items. The encapsulant encapsulates sidewalls of the die. The RDL structure is disposed on the encapsulant and the die. The passive device is disposed on and electrically bonded to the RDL structure. The protection layer covers a top surface of the passive device. The plurality of dummy items are disposed on the RDL structure and laterally aside the passive device and the protection layer.

In accordance with some embodiments of the disclosure, a method of forming a package structure include: forming an intermediate structure by the following processes: attaching a die to a dielectric layer; forming an encapsulant to encapsulate sidewalls of the die, forming a RDL structure on the encapsulant and the die, bonding a passive device to the RDL structure, and disposing a plurality of dummy items on the RDL structure and laterally aside the passive device; placing a tape on the intermediate structure, wherein the dummy items lift the tape, such that a space between the tape and the intermediate structure is in spatial communication with outer atmosphere in a process chamber; attaching the intermediate structure to a table through the tape, wherein a portion of the tape is in contact with both of the dummy items and the table; and forming a conductive terminal penetrating through the dielectric layer.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
   a die;
   an encapsulant, laterally encapsulating the die;
   a redistribution layer (RDL) structure, disposed on the die and the encapsulant;
   a passive device, disposed on and electrically bonded to the RDL structure; and
   a plurality of dummy items, disposed on the RDL structure and laterally aside the passive device, wherein top surfaces of the plurality of dummy items are higher than a top surface of the passive device,
   wherein each of the plurality of dummy items comprises a conductive core and a dielectric cap surrounding the conductive core, and
   wherein a portion of the encapsulant is in physical contact with a top surface of a portion of a passivation layer on the die, the RDL structure comprises a polymer layer over the encapsulant and the die, and the polymer layer is in physical contact with a sidewall of the portion of the encapsulant that is in physical contact with the top surface of the portion of the passivation layer on the die.

2. The package structure of claim 1, wherein the plurality of dummy items are attached to the RDL structure through adhesive layers respectively disposed between the plurality of dummy items and the RDL structure.

3. The package structure of claim 2, further comprising a filling layer disposed to fill a space between the passive device and the RDL structure, the filling layer laterally surrounds a connector of the passive device and a conductive pillar of the RDL structure, wherein a material of the filling layer is the same as materials of the adhesive layers.

4. The package structure of claim 2, wherein the adhesive layers completely cover bottom surfaces of the dummy items, respectively.

5. The package structure of claim 1, wherein each of the plurality of dummy items has a flat surface facing the RDL structure and a dome-like surface connected to the flat surface.

6. The package structure of claim 1, wherein the plurality of dummy items are electrically insulated from the die.

7. The package structure of claim 1, wherein the die comprises:
   a substrate;
   a passivation layer disposed over the substrate; and
   a plurality of sensing regions extending from a top surface of the passivation layer to a device layer on the substrate.

8. The package structure of claim 1, wherein a redistribution layer penetrates through the polymer layer and the encapsulant and is in contact with a conductive pad of the die.

9. A package structure, comprising:
   a die;
   an encapsulant, encapsulating sidewalls of the die;
   a RDL structure, disposed on the encapsulant and the die;
   a passive device, disposed on and electrically bonded to the RDL structure; and
   a plurality of dummy items, disposed on the RDL structure and laterally aside the passive device, wherein each of the plurality of dummy items comprises a first material and a second material covering the first material, and the second material is a dielectric cap,
   wherein the encapsulant has a portion covering a front surface of the die, the RDL structure comprises a polymer layer over the encapsulant and the die, and the polymer layer is in physical contact with a sidewall of the portion of the encapsulant, and
   wherein the RDL structure further comprises a redistribution layer penetrating through the portion of the encapsulant and in physical contact with a die pad of the die.

10. The package structure of claim 9, further comprising a filling layer, disposed to fill a space between the passive device and the RDL structure, and laterally surround a connector of the passive device.

11. The package structure of claim 9, wherein each of the plurality of dummy items has a flat surface facing the RDL structure and a dome-like surface connected to the flat surface.

12. The package structure of claim 10, wherein the plurality of dummy items are electrically insulated from the die.

13. The package structure of claim 9, wherein the first material is a conductive core.

14. The package structure of claim 9, wherein the plurality of dummy items comprise a molding compound.

15. A method of forming a package structure, comprising:
    forming an intermediate structure, comprising:
       attaching a die to a dielectric layer;
       forming an encapsulant to encapsulate sidewalls of the die;
       forming a RDL structure on the encapsulant and the die;
       bonding a passive device to the RDL structure; and
       disposing a plurality of dummy items on the RDL structure and laterally aside the passive device, wherein each of the plurality of dummy items comprises a first material and a second material covering the first material, and the second material is a dielectric cap;
    placing a tape on the intermediate structure, wherein the dummy items lift the tape, such that a space between the tape and the intermediate structure is in spatial communication with outer atmosphere in a process chamber;
    attaching the intermediate structure to a table through the tape, wherein a portion of the tape is in contact with both of the dummy items and the table; and
    forming a conductive terminal penetrating through the dielectric layer,
    wherein the encapsulant has a portion covering a front surface of the die, the RDL structure comprises a polymer layer over the encapsulant and the die, and the polymer layer is in physical contact with a sidewall of the portion of the encapsulant, and
    wherein the RDL structure further comprises a redistribution layer penetrating through the portion of the encapsulant and in physical contact with a die pad of the die.

16. The method of claim 15, wherein the dummy items are formed to be higher than the passive device, and a portion of the tape is in contact with the passive device and separate from the table.

17. The method of claim 15, wherein bonding the passive device and disposing the dummy items comprise:
    forming a flux material on a conductive pillar of the RDL structure;
    forming an adhesive material on the RDL structure;
    bonding the passive device to the conductive pillar, wherein the flux material facilitates the bonding between the passive device and the conductive pillar; and
    attaching the dummy items to the RDL structure through the adhesive material.

18. The method of claim 17, wherein the flux material and the adhesive material are formed of a same material through a same printing process.

19. The method of claim 15, wherein the first material is a conductive core.

20. The method of claim 15, wherein the plurality of dummy items are attached to the RDL structure through adhesive layers respectively disposed between the plurality of dummy items and the RDL structure, and the adhesive layers completely cover bottom surfaces of the dummy items, respectively.

* * * * *